(12) United States Patent
Lee et al.

(10) Patent No.: US 12,094,423 B2
(45) Date of Patent: Sep. 17, 2024

(54) ORGANIC LIGHT EMITTING DISPLAY DEVICE

(71) Applicant: LG Display Co., Ltd., Seoul (KR)

(72) Inventors: Sang Bin Lee, Paju-si (KR); In Sun Yoo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/974,275

(22) Filed: Oct. 26, 2022

(65) Prior Publication Data
US 2023/0215386 A1    Jul. 6, 2023

(30) Foreign Application Priority Data

Dec. 31, 2021 (KR) .................. 10-2021-0194682

(51) Int. Cl.
```
G09G 3/3291      (2016.01)
G09G 3/3266      (2016.01)
H01L 27/12       (2006.01)
H10K 59/121      (2023.01)
H10K 59/131      (2023.01)
H10K 59/32       (2023.01)
H10K 59/35       (2023.01)
```

(52) U.S. Cl.
CPC ......... *G09G 3/3291* (2013.01); *G09G 3/3266* (2013.01); *H01L 27/124* (2013.01); *H10K 59/1213* (2023.02); *H10K 59/1216* (2023.02); *H10K 59/131* (2023.02); *H10K 59/32* (2023.02); *H10K 59/353* (2023.02); *G09G 2310/0278* (2013.01); *G09G 2310/0297* (2013.01)

(58) Field of Classification Search
CPC ................. H05B 33/14; C09K 11/06; C09K 2211/1014; C09K 2211/1092; C09K 2211/1037; C09K 2211/1088; C09K 2211/1033; C09K 2211/1044; C09K 2211/1029; H01L 33/08; H10K 50/125; H10K 50/13; H10K 71/00; H10K 59/35

See application file for complete search history.

(56) References Cited

U.S. PATENT DOCUMENTS

| | | | |
|---|---|---|---|
| 2004/0036421 A1* | 2/2004 | Arnold ................. | H10K 59/353 315/169.3 |
| 2010/0238102 A1* | 9/2010 | Nakamura ........ | G02F 1/133514 345/88 |
| 2011/0248247 A1* | 10/2011 | Matsumoto ............ | H05B 33/14 438/35 |
| 2018/0358399 A1* | 12/2018 | Huang .............. | H01L 27/14603 |
| 2019/0228706 A1* | 7/2019 | Umeda ................ | G09G 3/3258 |

* cited by examiner

*Primary Examiner* — Shaheda A Abdin
(74) *Attorney, Agent, or Firm* — Birch, Stewart, Kolasch & Birch, LLP

(57) ABSTRACT

An organic light emitting display device can include a display panel including a plurality of data lines and a plurality of scan lines intersecting each other, and unit pixels disposed in a matrix arrangement, each of the unit pixels being disposed in a region where one scan line intersects three data lines; a data driving circuit configured to drive the plurality of data lines; and a gate driving circuit configured to drive the plurality of gate lines. Also, each of the unit pixels comprises two subpixels, and each of the two subpixels has a structure in which red, green and blue light emitting elements are stacked.

21 Claims, 16 Drawing Sheets

| P/L 1 | P/L 2 | P/L 3 | DATA 1 | DATA 2 | DATA 3 |
|---|---|---|---|---|---|
| VDD | VSS | VDD | O | X | X |

| P/L 1 | P/L 2 | P/L 3 | DATA 1 | DATA 2 | DATA 3 |
|---|---|---|---|---|---|
| VDD | VSS | VDD | X | X | O |

| P/L 1 | P/L 2 | P/L 3 | DATA 1 | DATA 2 | DATA 3 |
|-------|-------|-------|--------|--------|--------|
| VDD   | VSS   | VDD   | X      | O      | X      |

| P/L 1 | P/L 2 | P/L 3 | DATA 1 | DATA 2 | DATA 3 |
|-------|-------|-------|--------|--------|--------|
| VDD   | VSS   | VDD   | O      | O      | O      |

| P/L 1 | P/L 2 | P/L 3 | DATA 1 | DATA 2 | DATA 3 |
|---|---|---|---|---|---|
| VSS | VDD | VSS | O | X | X |

| P/L 1 | P/L 2 | P/L 3 | DATA 1 | DATA 2 | DATA 3 |
|---|---|---|---|---|---|
| VSS | VDD | VSS | X | X | O |

| P/L 1 | P/L 2 | P/L 3 | DATA 1 | DATA 2 | DATA 3 |
|---|---|---|---|---|---|
| VSS | VDD | VSS | O | △ | O |

ORGANIC LIGHT EMITTING DISPLAY DEVICE

CROSS-REFERENCE TO RELATED APPLICATION

This application claims priority to Korean Patent Application No. 10-2021-0194682 filed in the Republic of Korea on Dec. 31, 2021, the entirety of which is hereby incorporated by reference as if fully set forth herein.

BACKGROUND OF THE INVENTION

Field of the Invention

The present invention relates to an organic light emitting display device using a stack structure.

Discussion of the Related Art

Various technologies associated with a display device for displaying visual information in the form of an image or a picture are being developed. Among various display devices, an organic light emitting display device is being highlighted as a next-generation display in that the organic light emitting display device uses an organic light emitting diode, which is a self-luminous element configured to emit light from a light emitting material layer thereof through re-combination of an electron and a hole, thereby being capable of not only having characteristics such as rapid response time, high brightness, low driving voltage, and ultra-thinness, but also being implemented to have various shapes.

Also, a unit pixel often includes three subpixels, each displaying a different color of light (e.g., red, green, blue). However, the life span of the unit pixel may be limited by the weakest of the three subpixels (e.g., the lifespan may be determined by the first subpixel that fails). For instance, once one of the three different color subpixels fails, the pixel unit's ability to display images is impaired or ruined. Thus, dead pixels can be present within a display panel which can impair image quality and reduce the lifespan of the device.

SUMMARY OF THE INVENTION

Accordingly, the present disclosure is directed to an organic light emitting display device that substantially obviates one or more problems due to limitations and disadvantages of the related art.

An object of the present invention is to provide an organic light emitting display device capable of having a high resolution and a long lifespan using a stack structure.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device includes unit pixels each comprising two subpixels, in which each of the subpixels has a stack structure in which red, green and blue light emitting elements are organized in a stacked arrangement. For example, each pixel unit can include a pair of subpixels.

The red and green light emitting elements of a first one of the two subpixels can be stacked to form a hole only device (HOD) structure, and the red and green light emitting elements of a second one of the two subpixels can be stacked to form an electron only device (EOD) structure.

The first subpixel can include first to third electrodes sequentially stacked, a first blue light emitting element can be disposed between the first electrode and the second electrode, a first red light emitting element and a first green light emitting element can be disposed between the second electrode and the third electrode, to form a HOD structure.

The first blue light emitting element can include a hole injection layer, a first hole transport layer, a first blue emission material layer and an electron transfer layer sequentially stacked in this order between the first electrode and the second electrode, and the first red light emitting element and the first green light emitting element can include a second hole transport layer, a first red emission material layer, a charge generation layer, a first green emission material layer and a third hole transport layer sequentially stacked in this order between the second electrode and the third electrode.

Only the first red emission material layer can be enabled to emit light when a negative (−) voltage is applied to the first electrode and the third electrode, and a positive (+) voltage is applied to the second electrode, and only the first blue emission material layer and the first green emission material layer can be enabled to emit light when the positive (+) voltage is applied to the first electrode and the third electrode, and the negative (−) voltage is applied to the second electrode.

The second subpixel can include first to third electrodes sequentially stacked, a second blue light emitting element can be disposed between the first electrode and the second electrode, and a second red light emitting element and a second green light emitting element can be disposed between the second electrode and the third electrode, to form an EOD structure.

The second blue light emitting element can include a hole injection layer, a first hole transport layer, a first blue emission material layer and an electron transfer layer sequentially stacked in this order between the first electrode and the second electrode, and the second red light emitting element and the second green light emitting element can include a second electron transport layer, a second red emission material layer, a charge generation layer, a second green emission material layer and a third electron transfer layer sequentially stacked in this order between the second electrode and the third electrode.

Only the second green emission material layer can be enabled to emit light when a negative (−) voltage is applied to the first electrode and the third electrode, and a positive (+) voltage is applied to the second electrode, and only the second red emission material layer and the second blue emission material layer can be enabled to emit light when the positive (+) voltage is applied to the first electrode and the third electrode, and the negative (−) voltage is applied to the second electrode.

The unit pixel can be driven by one scan line and first to third data lines. The unit pixel can include a first red light emitting diode and a first green light emitting diode reversely connected to each other, a second red light emitting diode and a second green light emitting diode reversely connected to each other, and a blue light emitting diode, a first switching transistor including a gate electrode connected to the scan line, a first electrode connected to the first data line and a second electrode connected to a first node, thereby being controlled by a scan pulse of the scan line, to transmit a data voltage of the first data line to the first node, a first driving transistor including a gate electrode connected to the first node, a first electrode connected to a third power stage and a second electrode connected to a second node, thereby controlling current flowing through the first red light emitting diode and the first green light emitting diode in accordance with a voltage of the first node, a second switching transistor including a gate electrode connected to the scan line, a first electrode connected to the second data line and a second electrode connected to a third node, thereby being controlled by the scan pulse of the scan line, to transmit a data voltage of the second data line to the third node, a second driving transistor including a gate electrode connected to the third node, a first electrode connected to a first power stage and a second electrode connected to a fourth node, thereby controlling current flowing through the blue light emitting diode in accordance with a voltage of the third node, a third switching transistor including a gate electrode connected to the scan line, a first electrode connected to the third data line and a second electrode connected to a fifth node, thereby being controlled by the scan pulse of the scan line, to transmit a data voltage of the third data line to the fifth node, and a third driving transistor including a gate electrode connected to the fifth node, a first electrode connected to a second power stage and a second electrode connected to a sixth node, thereby controlling current flowing through the second red light emitting diode and the second green light emitting diode in accordance with a voltage of the fifth node. The first red light emitting diode and the first green light emitting diode can be connected between the second node and the third power stage, the blue light emitting diode can be connected between the fourth node and the first power stage, and the second red light emitting diode and the second green light emitting diode can be connected between the sixth node and the second power stage.

The unit pixel can further include a first capacitor connected between the first node and the second node, a second capacitor connected between the third node and the fourth node, and a third capacitor connected between the fifth node and the sixth node.

The unit pixel can further include multiplexers each connected to a corresponding one of the first to third power stages and configured to select one of a positive (+) voltage and a negative (−) voltage in accordance with a select signal and to supply the selected voltage to the corresponding one of the first to third power stages.

Only the first green light emitting diode can emit light when a positive (+) voltage is applied to the first power stage and the third power stage, a negative (−) voltage is applied to the second power stage, and a data voltage is supplied to the first data line. Only the second red light emitting diode can emit light when the positive (+) voltage is applied to the first power stage and the third power stage, and the negative (−) voltage is applied to the second power stage, and a data voltage is supplied to the third data line.

Only the blue light emitting diode can emit light when a positive (+) voltage is applied to the first power stage and the third power stage, a negative (−) voltage is applied to the second power stage, and a data voltage is supplied to the second data line.

The first green light emitting diode, the second red light emitting diode, and the blue light emitting diode can emit light when a positive (+) voltage is applied to the first power stage and the third power stage, a negative (−) voltage is applied to the second power stage, and a data voltage is supplied to each of the first to third data lines and, as such, the unit pixel can di splay white.

Only the first red light emitting diode can emit light when a negative (−) voltage is applied to the first power stage and the third power stage, a positive (+) voltage is applied to the second power stage, and a data voltage is supplied to the first data line. Only the second green light emitting diode can emit light when a negative (−) voltage is applied to the first power stage and the third power stage, a positive (+) voltage is applied to the second power stage, and a data voltage is supplied to the third data line.

The first red light emitting diode and the second green light emitting diode can emit light when a negative (−) voltage is applied to the first power stage and the third power stage, a positive (+) voltage is applied to the second power stage, and a data voltage is supplied to each of the first to third data lines and, as such, the unit pixel can display yellow.

The organic light emitting display device having the above-described features in accordance with the example embodiments of the present invention has the following effects.

First, the unit pixel is constituted by two subpixels, and is driven by a DC voltage Ac and, as such, can emit red, green, blue and white. Accordingly, an enhancement in resolution can be achieved.

Second, light emitting layers used to emit white and to emit red and green can be differently driven and, as such, an organic light emitting display device having a long lifespan can be realized.

Third, in the situation of a blue light emitting diode having a relatively short lifespan, the blue light emitting diode simultaneously drives the two subpixels and, as such, an organic light emitting display device having a long lifespan can be realized.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE EMBODIMENTS

Figure 1:
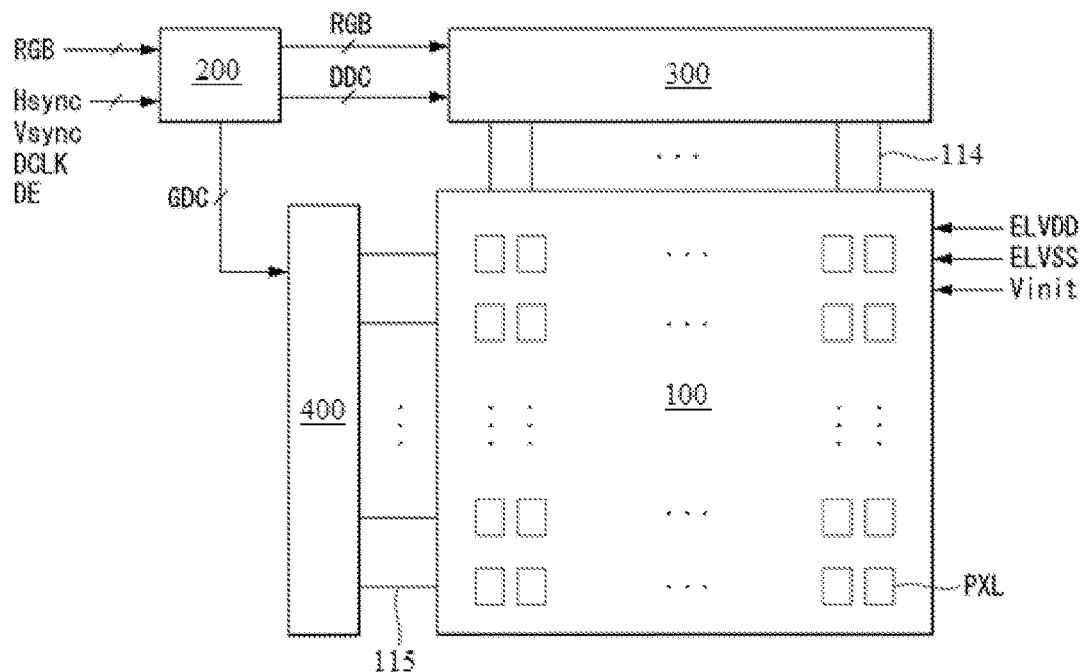
FIG. 1 is a view showing an organic light emitting display device according to an embodiment of the present invention.

Hereinafter, a pixel circuit according to an example embodiment of the present invention and an organic light emitting display device including the same, which have the above-described features, will be described in detail with reference to the accompanying drawings. Throughout the specification, the same reference numerals designate substantially the same constituent elements.

Although a device, which will be described hereinafter, will be described in conjunction with an example in which the device includes an n-type thin film transistor (TFT), the device can be implemented to include a p-type TFT or a TFT having a type in which both the n type and the p type are present. The TFT can be a triple-electrode element including a gate, a source and a drain. The source is an electrode configured to supply a carrier to the transistor. The carrier in the TFT first flows from the source. The drain is an electrode from which the carrier is discharged from the TFT to an exterior of the TFT. That is, the carrier in the TFT flows from the source to the drain.

In the situation of an n-type TFT, a source voltage has a lower level than a drain voltage such that an electron can flow from a source to a drain because the electron is a carrier. In the n-type TFT, current flows from the drain to the source because the electron flows from the source to the drain. Conversely, in the situation of a p-type TFT, a source voltage has a higher level than a drain voltage such that a hole can flow from a source to a drain because the hole is a carrier. In the p-type TFT, current flows from the source to the drain because the hole flows from the source to the drain. In a TFT, however, a source and a drain can be interchanged in accordance with voltages applied thereto. Taking into consideration such conditions, one of the source and the drain will be referred to as a "first electrode," and the other of the source and the drain will be referred to as a "second electrode."

FIG. 1 shows an organic light emitting display device according to an embodiment of the present invention.

Referring to FIG. 1, the organic light emitting display device according to an embodiment of the present invention includes a display panel 100 formed with pixels PXL, a data driving circuit 300 configured to drive data lines 114, a gate driving circuit 400 configured to drive gate lines 115, and a timing controller 200 configured to control driving timings of the data driving circuit 300 and the gate driving circuit 400.

A plurality of data lines 114 and a plurality of gate lines 115 intersect each other at the display panel 100. The unit pixels PXL are disposed in the form of a matrix such that each of the unit pixels PXL is disposed in a region where one gate line 115 intersects three data lines 114. The unit pixels PXL disposed on the same horizontal line constitute one pixel row. The unit pixels PXL disposed in one pixel row are connected to the one gate line 115, and the one gate line 115 can include one or more scan lines and one or more emission lines.

That is, each unit pixel PXL can be connected to three data lines 114, one or more scan lines, and one or more emission lines. The unit pixels PXL can receive, in common, high-level and low-level driving voltages VDD and VSS from a power generator.

TFTs constituting one unit pixel PXL can be implemented as an oxide TFT including an oxide semiconductor layer. The oxide TFT is advantageous in terms of enlargement of the display panel 100, taking into consideration all of electron mobility, process deviation and the like. Of course, the example embodiments of the present invention are not limited to the above-described condition, and the semiconductor layer of the TFT can be formed of amorphous silicon, polysilicon or the like.

Each unit pixel PXL is constituted by two subpixels (e.g., a pair of subpixels), and each of the subpixels has a stack structure of red, green and blue emitting elements.

A first one of the two subpixels constituting one unit pixel PXL is constituted by a hole only device (HOD) structure, and a second one of the two-subpixels is constituted by an electron only device (EOD) stack structure. A concrete configuration will be described later.

The timing controller 200 rearranges digital video data RGB input from an exterior thereof in conformity with a resolution of the display panel 100, and supplies the rearranged digital video data RGB to the data driving circuit 300. In addition, the timing controller 200 generates a data control signal DDC for control of an operation timing of the data driving circuit 300 and a gate control signal GDC for control of an operation timing of the gate driving circuit 400 based on timing signals such as a vertical synchronization signal Vsync, a horizontal synchronization signal Hsync, a dot clock signal DCLK, a data enable signal DE, etc.

The data driving circuit 300 converts the digital video data RGB input from the timing controller 200 into an analog data voltage based on the data control signal DDC.

The gate driving circuit 400 can generate a scan signal and an emission signal based on the gate control signal GDC. The gate driving circuit 400 can include a scan driver and an emission driver. The scan driver can generate a scan signal in a row-sequential manner in order to drive one or more scan lines connected to each pixel row, and can supply the scan signal to the scan lines. The emission driver can generate an emission signal in a row-sequential manner in order to drive one or more emission lines connected to each pixel row, and can supply the emission signal to the emission lines.

The gate driving circuit 400 as described above can be directly formed in the display panel 100 in a gate-driver-in-panel (GIP) manner.

Figure 2:
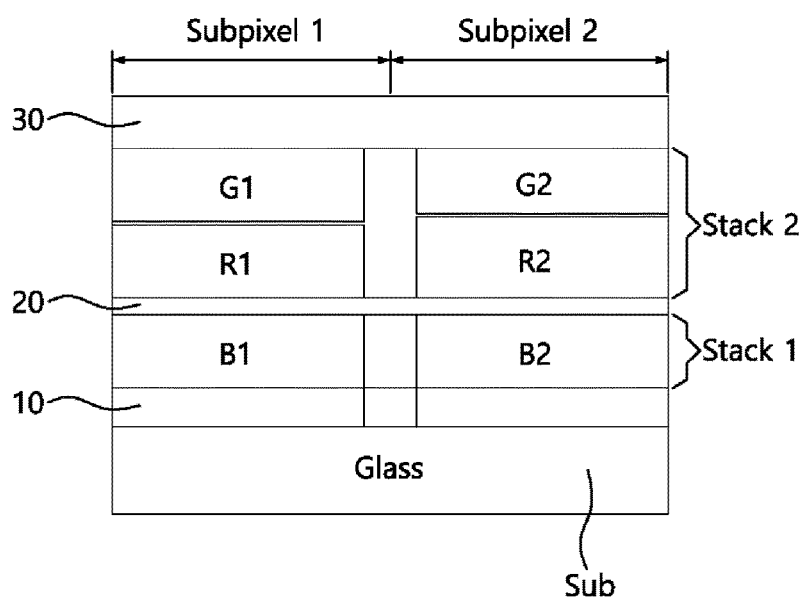
FIG. 2 is a schematic sectional view of a unit pixel according to an embodiment of the present invention.

FIG. 2 is a schematic sectional view of a unit pixel according to an embodiment of the present invention.

As shown in FIG. 2, the unit pixel includes first and second subpixels Subpixel 1 and Subpixel 2, and each of the first and second subpixels Subpixel 1 and Subpixel 2 has a structure in which two stacks Stack 1 and Stack 2 are stacked.

That is, a first electrode 10 is disposed on a substrate Sub, a first stack Stack 1 is disposed on the first electrode 10, and a second electrode 20 is disposed on the first stack Stack 1. In addition, a second stack Stack 2 is disposed on the second electrode 20, and a third electrode 30 is disposed on the second stack Stack 2.

The first stack Stack 1 includes blue emission materials B1 and B2, and the second stack Stack 2 includes red emission materials R1 and R2 and green emission materials G1 and G2.

In this situation, the first subpixel Subpixel 1 is constituted by a hole only device (HOD) element, and the second subpixel Subpixel 2 is constituted by an electron only device (EOD) element.

Figure 3:
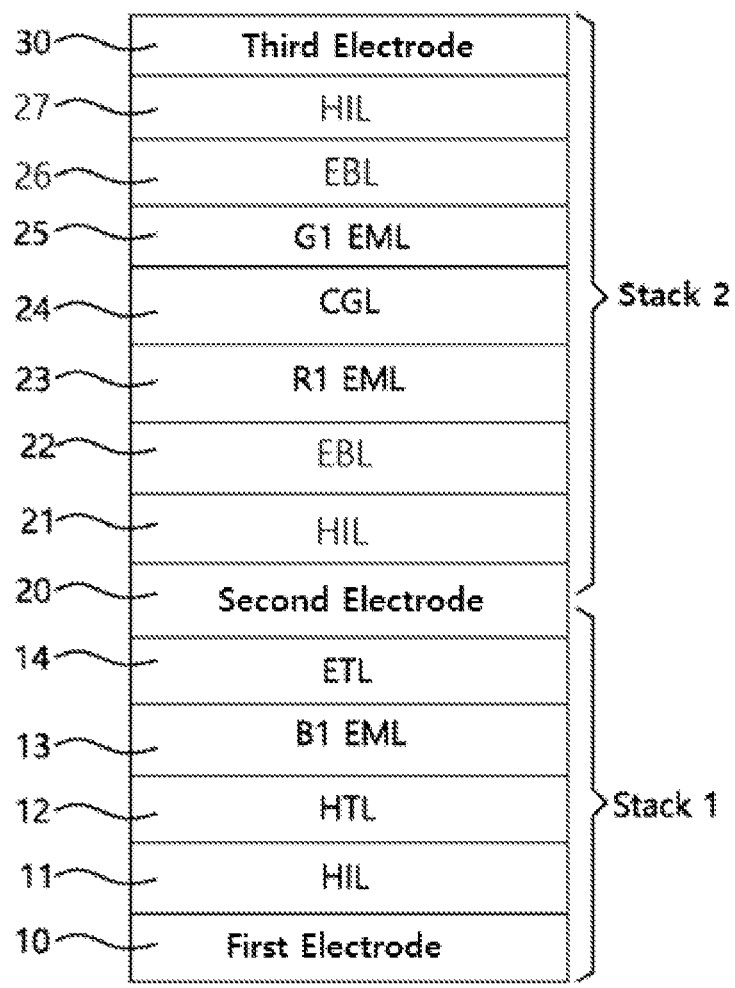
FIG. 3 is a view of a structure of an HOD element according to an embodiment of the present invention.
Figure 4:
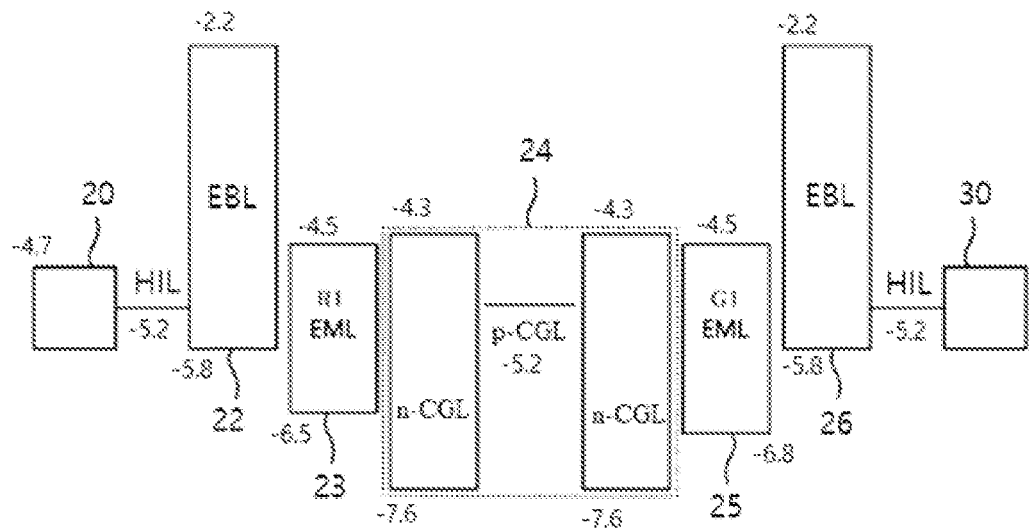
FIG. 4 is an energy level diagram explaining an operation principle of the HOD element of FIG. 3 according to an embodiment of the present invention.
Figure 5:
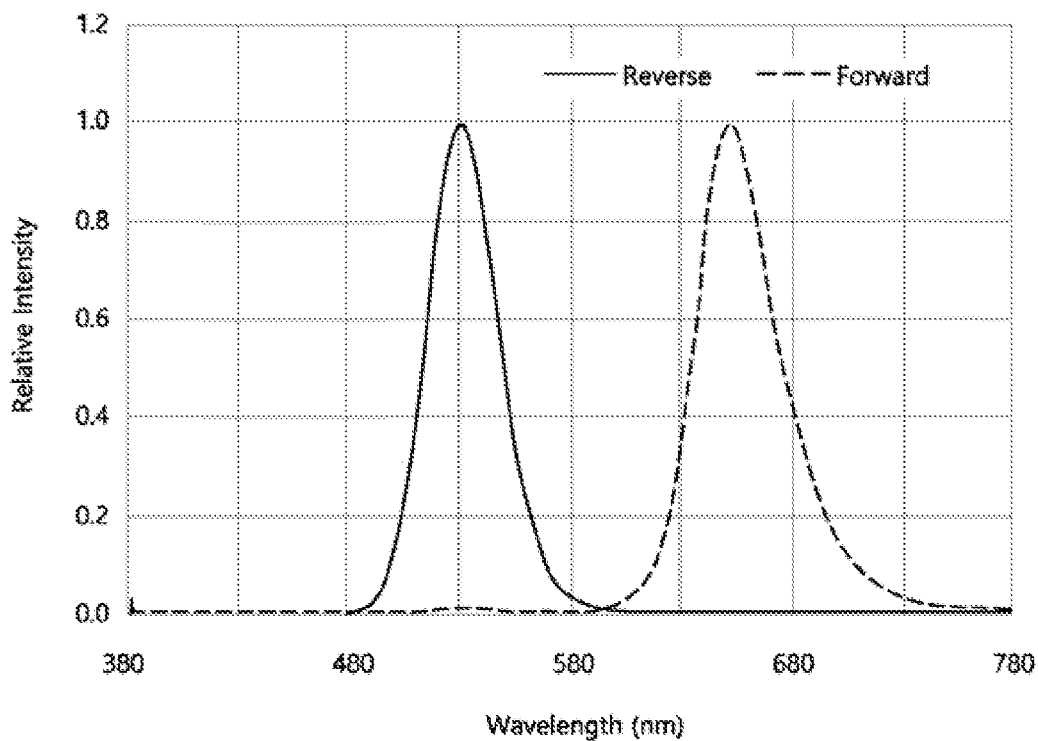
FIG. 5 is a graph showing a spectrum according to the HOD element of FIG. 3 according to an embodiment of the present invention.

FIG. 3 is a view of a structure of an HOD element according to an embodiment of the present invention. FIG. 4 is an energy level diagram explaining an operation principle of the HOD element of FIG. 3. FIG. 5 is a graph showing a spectrum according to the HOD element of FIG. 3.

As shown in FIG. 3, in a first subpixel Subpixel 1 according to the embodiment of the present invention, a first stack Stack 1 is disposed between a first electrode 10 and a second electrode 20, and a second stack Stack 2 is disposed between the second electrode 20 and a third electrode 30.

The first stack Stack 1 is configured as a first hole injection layer (HIL) 11, a first hole transport layer (HTL) 12, a first blue emission material layer (B1 EML) 13, and an electron transfer layer (ETL) 14 that are sequentially stacked on the first electrode 10 in this order.

The second stack Stack 2 is configured as a second hole injection layer (HIL) 21, a first electron blocking layer (EBL) 22, a first red emission material layer (R1 EML) 23, a charge generation layer (CGL) 24, a first green emission material layer (G1 EML) 25, a second electron blocking layer (EBL) 26, and a third hole injection layer (HIL) 27 are sequentially stacked on the second electrode 20 in this order.

The second stack Stack 2 of the first subpixel 1 has an HOD structure.

The second stack in the HOD structure as shown in FIGS. 3 and 4 is configured such that the first red emission material layer 23 and the first green emission material layer 25 are symmetrical with each other with reference to the charge generation layer 24.

FIG. 4 shows that the charge generation layer (CGL) 24 has a structure in which a p-CGL is disposed between two n-CGLs. The n-CGL/p-CGL/n-CGL structure of the charge generation layer (CGL) 24 can be formed by a ZnO/PEDOT:PSS/ZnO layer.

As shown in FIG. 4, when a forward bias is applied to the HOD structure such that a positive (+) voltage is applied to the second electrode 20, and a negative (−) voltage is applied to the third electrode 30, holes and electrodes are generated in the charge generation layer (CGL) 24. The electrons and holes are generated at an interface between the n-CGL and the p-CGL of the charge generation layer (CGL) 24 by the forward bias drift due to the applied voltages.

Holes transitioned from the second electrode 20 and electrons generated in the charge generation layer 24 move to the first red emission material layer (R1 EML) 23, thereby forming excitons. As a result, the first red emission material layer (R1 EML) 23 generates visible light.

In this situation, electrons transitioned from the third electrode 30 are blocked by the second electron blocking layer (EBL) 26. Accordingly, the first green emission material layer (G1 EML) 25 does not emit light because the electrons transitioned from the third electrode 30 cannot move to the first green emission material layer (G1 EML) 25.

Conversely, when a reverse bias is applied to the HOD structure such that a negative (−) voltage is applied to the second electrode 20, and a positive (+) voltage is applied to the third electrode 30, holes and electrons are generated in the charge generation layer (CGL) 24. The electrons and holes are generated at the interface between the n-CGL and the p-CGL of the charge generation layer (CGL) 24 by the reverse bias drift due to the applied voltages.

Holes transitioned from the third electrode 30 and electrons generated in the charge generation layer (CGL) 24 move to the first green emission material layer (G1 EML) 25, thereby forming excitons. As a result, the first green emission material layer (G1 EML) 25 generates visible light.

In this situation, electrons transitioned from the second electrode 20 are blocked by the first electron blocking layer (EBL) 22. Accordingly, the first red emission material layer (R1 EML) 23 does not emit light because the electrons transitioned from the second electrode 20 cannot move to the first red emission material layer (G1 EML) 23.

Since the structure of FIG. 3 only uses hole current in principle, this structure is referred to as a "hole only device (HOD)."

In accordance with the above-described principle, as shown in FIG. 5, when a forward bias is applied to an HOD element, the HOD element emits red, whereas, when a reverse bias is applied to the HOD element, the HOD element emits green. In other words, the first subpixel Subpixel 1 can selectively switch between displaying two different colors depending on how it is biased (e.g., forward bias to emit red, and reverse bias to emit green).

Figure 6:
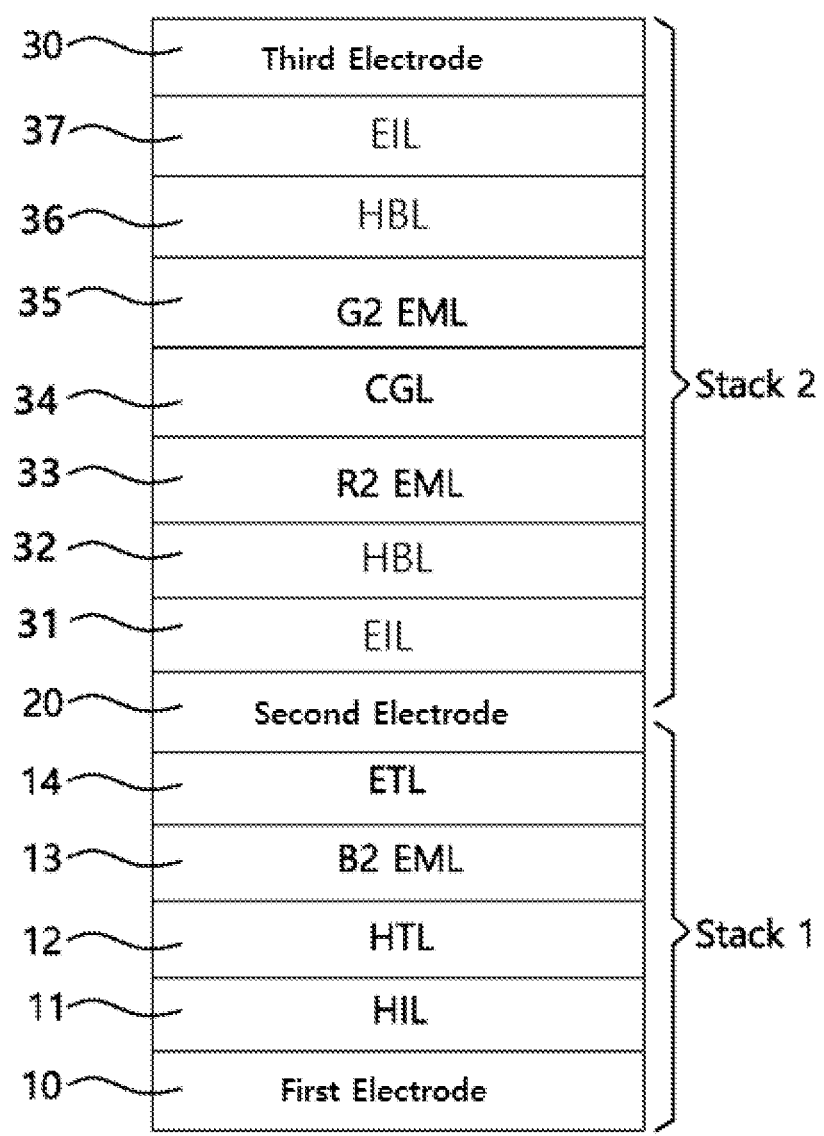
FIG. 6 is a view of a structure of an EOD element according to an embodiment of the present invention.
Figure 7:
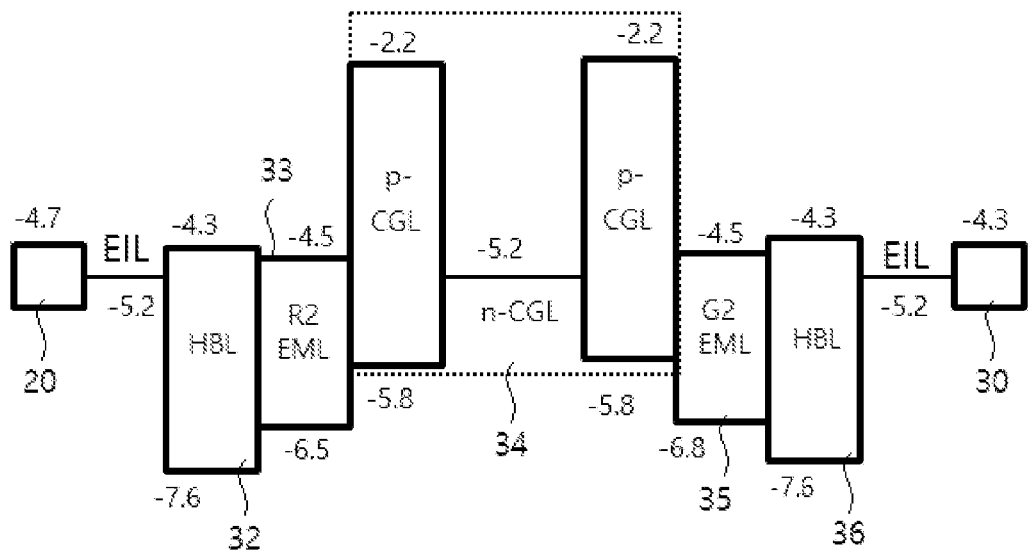
FIG. 7 is an energy level diagram explaining an operation principle of the EOD element of FIG. 6 according to an embodiment of the present invention.
Figure 8:
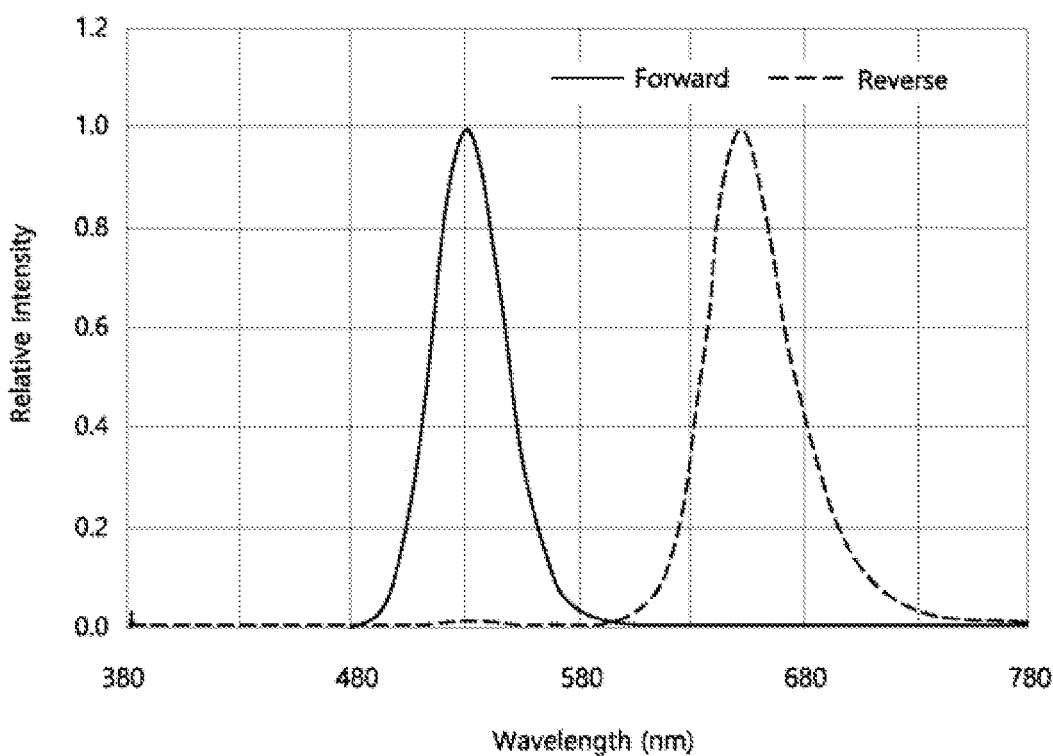
FIG. 8 is a graph showing a spectrum according to the EOD element of FIG. 6 according to an embodiment of the present invention.

FIG. 6 is a view of a structure of an EOD element according to an embodiment of the present invention. FIG. 7 is an energy level diagram explaining an operation principle of the EOD element of FIG. 6. FIG. 8 is a graph showing a spectrum according to the EOD element of FIG. 6.

As shown in FIG. 6, in a second subpixel Subpixel 2 according to the embodiment of the present invention, a first stack Stack 1 is disposed between a first electrode 10 and a second electrode 20, and a second stack Stack 2 is disposed between the second electrode 20 and a third electrode 30.

The first stack Stack 1 is configured as a first hole injection layer (HIL) 11, a first hole transport layer (HTL) 12, a second blue emission material layer (B2 EML) 13, and an electron transfer layer (ETL) 14 that are sequentially stacked on the first electrode 10 in this order.

The second stack Stack 2 is configured as a first electron injection layer (EIL) 31, a first hole blocking layer (HBL) 32, a second red emission material layer (R2 EML) 33, a charge generation layer (CGL) 34, a second green emission material layer (G2 EML) 35, a second hole blocking layer (HBL) 36, and a second hole injection layer (HIL) 37 that are sequentially stacked on the second electrode 20 in this order.

The second stack Stack 2 of the second subpixel Subpixel 2 has an EOD structure.

The second stack in the EOD structure as shown in FIGS. 6 and 7 is configured such that the second red emission material layer 33 and the second green emission material layer 35 are symmetrical with each other with reference to the charge generation layer 34.

FIG. 7 shows that the charge generation layer (CGL) 34 has a structure in an n-CGL is disposed between two p-CGLs. The p-CGL/n-CGL/p-CGL structure of the charge generation layer (CGL) 34 can be formed by a PVK/PEDOT:PSS/PVK layer.

As shown in FIG. 7, when a forward bias is applied to the EOD structure such that a positive (+) voltage is applied to the second electrode 20, and a negative (−) voltage is applied to the third electrode 30, holes and electrons are generated in the charge generation layer (CGL) 34. The electrons and holes are generated at an interface between the n-CGL and the p-CGL of the charge generation layer (CGL) 34 by the forward bias drift due to the applied voltages.

Electrons transitioned from the third electrode 30 and holes generated in the charge generation layer (CGL) 34 move to the second green emission material layer (G2 EML) 35, thereby forming excitons. As a result, the second green emission material layer (G2 EML) 35 generates visible light.

In this situation, holes transitioned from the second electrode 20 are blocked by the first hole blocking layer (HBL) 32. Accordingly, the second red emission material layer (R2 EML) 33 does not emit light because the holes transitioned from the second electrode 20 cannot move to the second red emission material layer (R2 EML) 33.

Conversely, when a reverse bias is applied to the EOD structure such that a negative (−) voltage is applied to the second electrode 20, and a positive (+) voltage is applied to the third electrode 30, holes and electrons are generated in the charge generation layer (CGL) 34. The electrons and holes are generated at the interface between the n-CGL and the p-CGL of the charge generation layer (CGL) 34 by the reverse bias drift due to the applied voltages.

Electrons transitioned from the second electrode 20 and holes generated in the charge generation layer (CGL) 34 move to the second red emission material layer (R2 EML) 33, thereby forming excitons. As a result, the second red emission material layer (R2 EML) 33 generates visible light.

In this situation, holes transitioned from the third electrode 30 are blocked by the second hole blocking layer (HBL) 36. Accordingly, the second green emission material layer (G2 EML) 35 does not emit light because the holes transitioned from the third electrode 30 cannot move to the second green emission material layer (G2 EML) 35.

Since the structure of FIG. 6 only uses electron current in principle, this structure is referred to as an "electron only device (EOD)."

In accordance with the above-described principle, when a forward bias is applied to an EOD element, the EOD element emits green, whereas, when a reverse bias is applied to the EOD element, the EOD element emits red. In other words, the second subpixel Subpixel 2 can selectively switch between displaying two different colors depending on how it is biased (e.g., forward bias to emit green, and reverse bias to emit red). In addition, enough though the second subpixel Subpixel 2 can operate in an opposite manner than the first subpixel Subpixel 1. For example, when the first subpixel Subpixel 1 is forward biased, the first subpixel Subpixel 1 emits red, but when the second subpixel Subpixel 2 is forward biased, the second subpixel Subpixel 2 emits green. Also, when the first subpixel Subpixel 1 is reversed biased, the first subpixel Subpixel 1 emits green, but when the second subpixel Subpixel 2 is reversed biased, the second subpixel Subpixel 2 emits red.

Hereinafter, a circuit configuration and layout and cross-sectional structures of the unit pixel according to the embodiment of the present invention configured as described above will be described.

Figure 9:
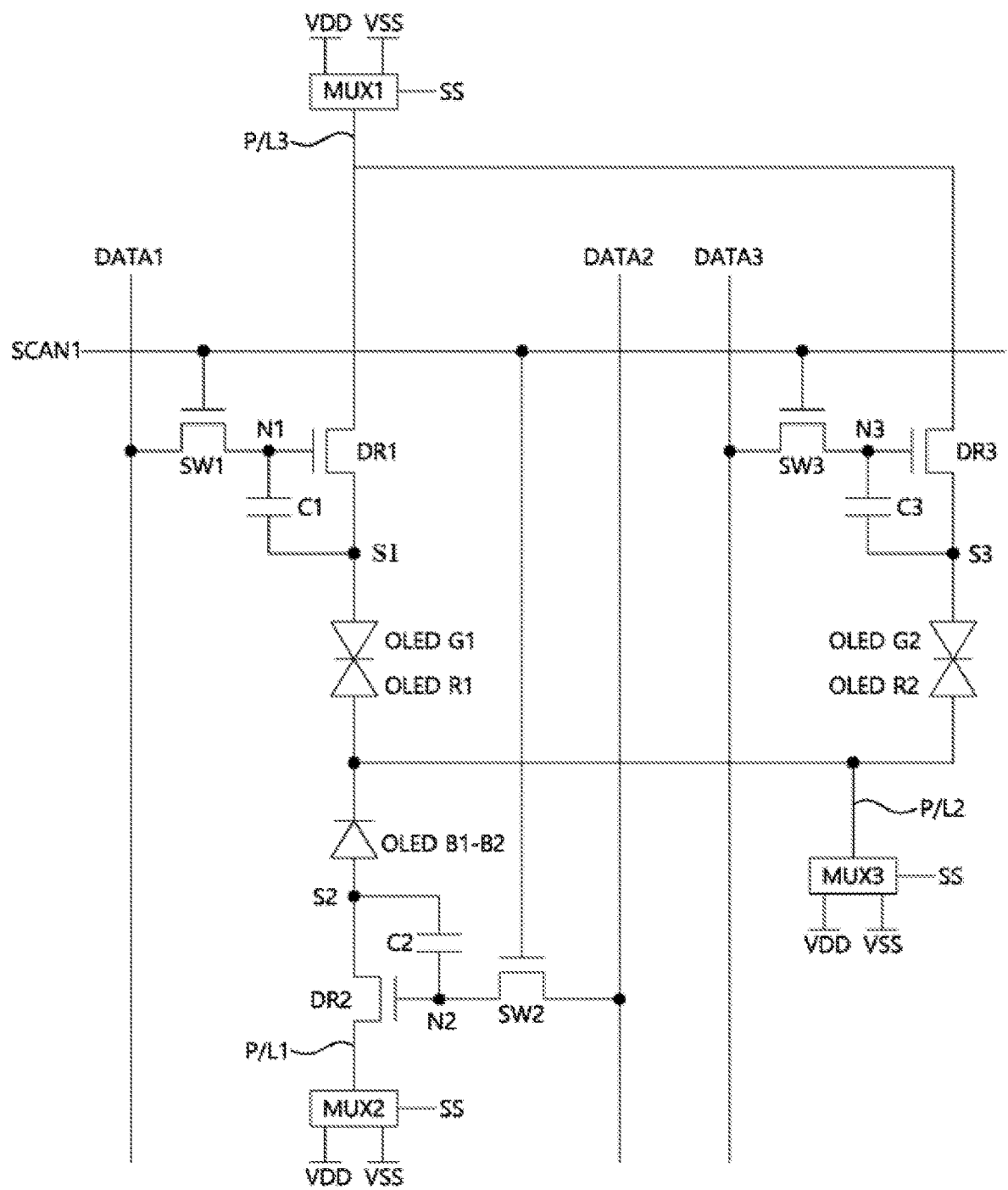
FIG. 9 is a circuit diagram of a circuit configuration of one unit pixel of an organic light emitting display panel according to an embodiment of the present invention.

FIG. 9 is a circuit diagram of a circuit configuration of one unit pixel of an organic light emitting display panel according to an embodiment of the present invention.

First, in FIG. 9, the first stack Stack 1 shown in FIG. 3 and constituted by the first electrode 10, the hole injection layer (HIL) 11, the first hole transfer layer (HTL) 12, the first blue emission material layer (B1 EML) 13, the electron transfer layer (ETL) 14 and the second electrode 20 shown in FIG. 3 is indicated as a first blue light emitting diode OLED B1.

The second stack Stack 2 shown in FIG. 3 and constituted by the second electrode 20, the second hole injection layer (HIL) 21, the first electron blocking layer (EBL) 22, the first red emission material layer (R1 EML) 23, the charge generation layer (CGL) 24, the first green emission material layer (G1 EML) 25, the second electron blocking layer (EBL) 26, the third hole injection layer (HIL) 27 and the third electrode 30 shown in FIG. 3 is indicated as a first red light emitting diode OLED R1 and a first green light emitting diode OLED G1.

In addition, the first stack Stack 1 shown in FIG. 6 and constituted by the first electrode 10, the first hole injection layer (HIL) 11, the first hole transport layer (HTL) 12, the second blue emission material layer (B2 EML) 13, the electron transfer layer (ETL) 14 and the second electrode 20 shown in FIG. 6 is indicated as a second blue light emitting diode OLED B2.

The second stack Stack 2 shown in FIG. 6 and constituted by the second electrode 20, the first electron injection layer (EIL) 31, the first hole blocking layer (HBL) 32, the second red emission material layer (R2 EML) 33, the charge generation layer (CGL) 34, the second green emission material layer (G2 EML) 35, the second hole blocking layer (HBL) 36, the second hole injection layer (HIL) 37 and the third electrode 30 shown in FIG. 6 is indicated as a second red light emitting diode OLED R2 and a second green light emitting diode OLED G2.

The first red light emitting diode OLED R1 and the first green light emitting diode OLED G1 are symmetrical with each other with reference to the charge generation layer CGL corresponding thereto. The second red light emitting diode OLED R2 and the second green light emitting diode OLED G2 are symmetrical with each other with reference to the charge generation layer CGL corresponding thereto.

Accordingly, the first red light emitting diode OLED R1 and the first green light emitting diode OLED G1 are shown as being reversely connected to each other, and the second red light emitting diode OLED R2 and the second green light emitting diode OLED G2 are shown as being reversely connected to each other.

In addition, the first blue light emitting diode OLED B1 and the second blue light emitting diode OLED B2 have the same stack structure and, as such, are shown as one blue light emitting diode OLED B1-B2 (e.g., as an equivalent circuit). In FIG. 9, accordingly, the unit pixel is shown as being constituted by five light emitting diodes.

In an embodiment of the present invention, switching of voltages applied to the first to third electrodes 10, 20 and 30 should also be required for selective driving of the five light emitting diodes constituting the unit pixel.

To this end, the unit pixel uses at least three power stages P/L1, P/L2 and P/L3, and three multiplexers MUX1, MUX2 and MUX3 are connected to the power stages P/L1, P/L2 and P/L3, respectively. Each of the multiplexers MUX1, MUX2 and MUX3 is switched by a select signal SS, thereby outputting one of a high-level voltage VDD and a low-level voltage VSS. For example, the unit pixel can be switched between being driven with a forward bias and a reverse bias just by changing the selections of the high-level voltage VDD and the low-level voltage VSS, via the multiplexers and the select signal SS (e.g., the unit pixel can be switched back and forth between two different driving modes).

As shown in FIG. 9, the unit pixel includes one scan line SCAN1, three data lines DATA1, DATA2 and DATA3, and a first red light emitting diode OLED R1 and a first green light emitting diode OLED G1 reversely connected to each other, a second red light emitting diode OLED R2 and a second green light emitting diode OLED G2 reversely connected to each other and a blue light emitting diode OLED B1-B2, which are driven by three power stages P/L1, P/L2 and P/L3.

Here, the first power stage P/L1 is a power line for applying a voltage to the first electrode 10 shown in FIGS. 2, 3 and 6, the second power stage P/L2 is a power line for applying a voltage to the second electrode 20 shown in FIGS. 2, 3 and 6, and the third power stage P/L3 is a power line for applying a voltage to the third electrode 30 shown in FIGS. 2, 3 and 6 (e.g., the second power stage P/L2 is connected between the first power stage P/L1 and the third power stage P/L3, which respectively correspond to the second electrode, the first electrode and the third electrode in each of the first subpixel Subpixel 1 and the second subpixel Subpixel 2).

Hereinafter, a configuration of a pixel circuit configured to selectively drive the light emitting diodes OLED R1, OLED R2 and OLED G1, OLED G2 and OLED B1-B2 configured as described above will be described.

A pixel circuit of the unit pixel according to an embodiment of the present invention includes first to third switching transistors SW1 to SW3, first to third driving transistors DR1 to DR3, and first to third capacitors C1 to C3.

The first switching transistor SW1 is connected to the scan line SCAN1 at a gate electrode thereof while being connected to the first data line DATA1 at a first electrode thereof and connected to a node N1 at a second electrode thereof and, as such, is controlled by a scan pulse of the scan line SCAN1, thereby transmitting a data voltage of the first data line DATA1 to the node N1.

The second switching transistor SW2 is connected to the scan line SCAN1 at a gate electrode thereof while being connected to the second data line DATA2 at a first electrode thereof and connected to a node N2 at a second electrode thereof and, as such, is controlled by the scan pulse of the scan line SCAN1, thereby transmitting a data voltage of the second data line DATA2 to the node N2.

The third switching transistor SW3 is connected to the scan line SCAN1 at a gate electrode thereof while being connected to the third data line DATA3 at a first electrode thereof and connected to a node N3 at a second electrode thereof and, as such, is controlled by the scan pulse of the scan line SCAN1, thereby transmitting a data voltage of the third data line DATA3 to the node N3.

The first driving transistor DR1 is connected to the node N1 at a gate electrode thereof while being connected to the third power stage P/L3 at a first electrode thereof and connected to a node S1 at a second electrode thereof and, as such, controls current flowing through the first red light emitting diode OLED R1 and the first green light emitting diode OLED G1 in accordance with a voltage of the node N1.

The second driving transistor DR2 is connected to the node N2 at a gate electrode thereof while being connected to the first power stage P/L1 at a first electrode thereof and connected to a node S2 at a second electrode thereof and, as such, controls current flowing through the blue light emitting diode OLED B1-B2 in accordance with a voltage of the node N2.

The third driving transistor DR3 is connected to the node N3 at a gate electrode thereof while being connected to the second power stage P/L2 at a first electrode thereof and connected to a node S3 at a second electrode thereof and, as such, controls current flowing through the second red light emitting diode OLED R2 and the second green light emitting diode OLED G2 in accordance with a voltage of the node N3.

The first capacitor C1 is connected between the node N1 and the node S1 and, as such, stores a data voltage supplied to the node N1 for one frame.

The second capacitor C2 is connected between the node N2 and the node S2 and, as such, stores a data voltage supplied to the node N2 for one frame.

The third capacitor C3 is connected between the node N3 and the node S3 and, as such, stores a data voltage supplied to the node N3 for one frame.

In this situation, the first red light emitting diode OLED R1 and the first green light emitting diode OLED G1 reversely connected to each other are connected between the node S1 and the second power stage P/L2, the blue light emitting diode OLED B1-B2 is connected between the node S2 and the first power stage P/L1, and the second red light emitting diode OLED R2 and the second green light emitting diode OLED G2 reversely connected to each other are connected between the node S3 and the second power stage P/L2.

Next, layout and cross-sectional views of the unit pixel having the above-described circuit configuration according to an embodiment of the present invention will be described.

Figure 10:
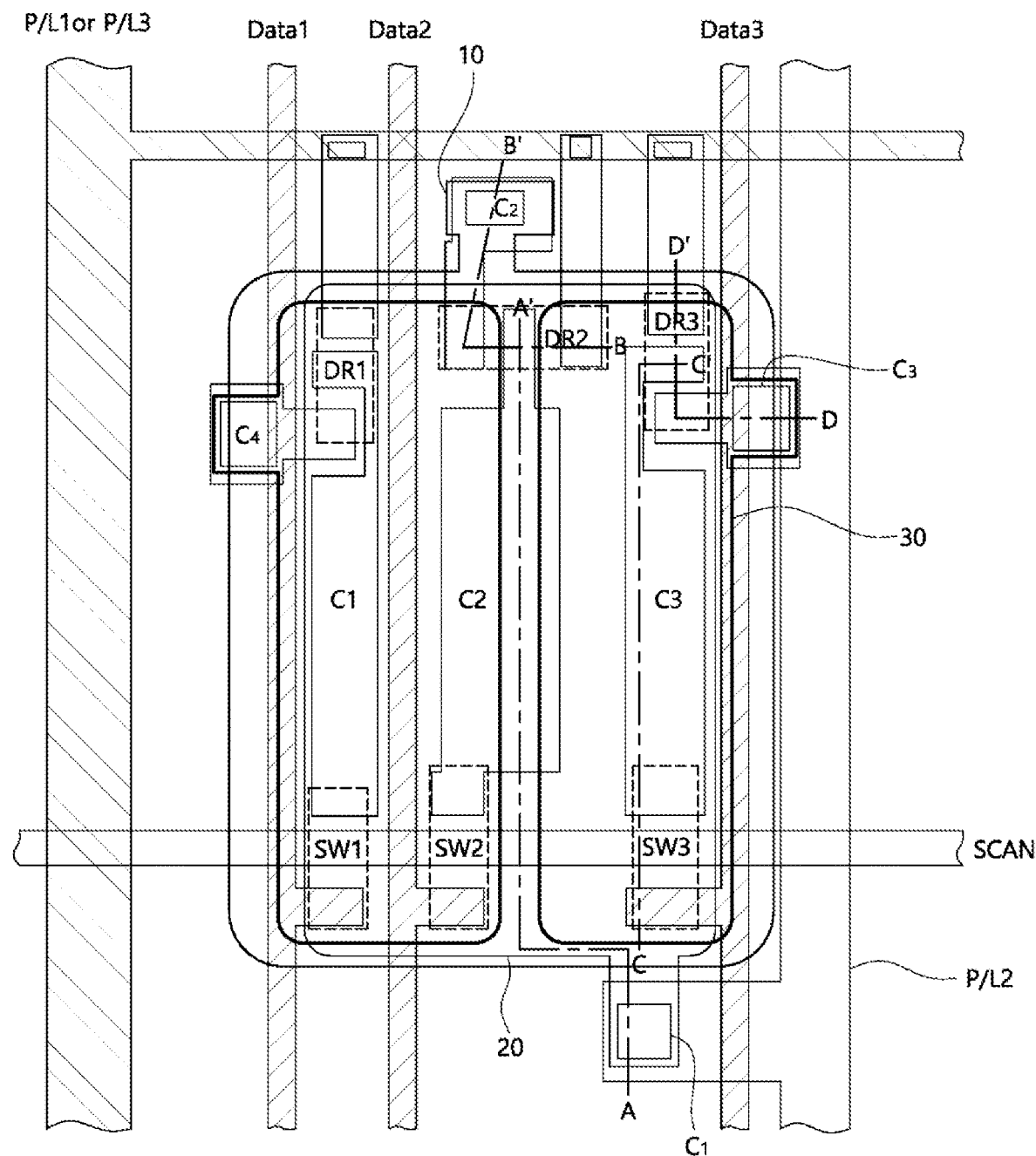
FIG. 10 is a layout view of a unit pixel according to an embodiment of the present invention.
Figure 11:
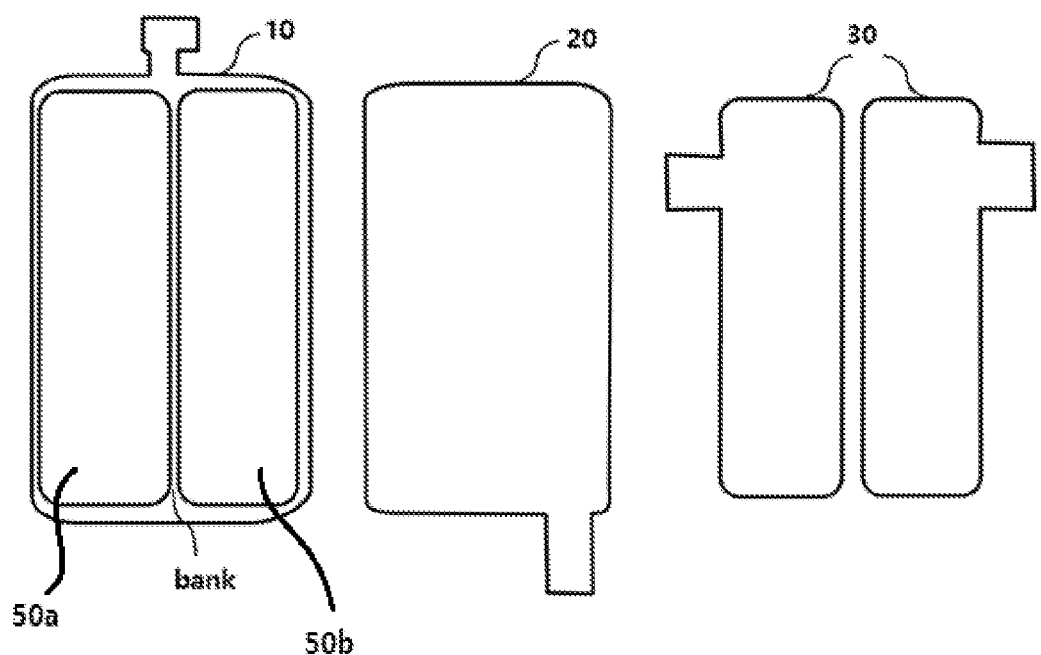
FIG. 11 is a plan view of a first electrode, a second electrode, a third electrode and a bank structure shown in FIG. 10 according to an embodiment of the present invention.

FIG. 10 is a layout view of a unit pixel according to an embodiment of the present invention. FIG. 11 is a plan view of a first electrode, a second electrode, a third electrode and a bank structure shown in FIG. 10.

The unit pixel according to the embodiment of the present invention includes two subpixels (cf. FIG. 2), and is driven by one scan line SCAN, three data lines Data1, Data2 and Data 3, and two power stages P/L1 or P/3 and P/L2.

The first power stage P/L1 or the third power stage P/L3 shown in FIG. 10 is a power line for applying a voltage to the first electrode 10 and the third electrode 30 shown in FIG. 6, and the second power stage P/L2 is a power line for applying a voltage to the second electrode 20 shown in FIGS. 3 and 6.

A first switching transistor SW1 is disposed in a region where the scan line SCAN and the first data line Data1 intersect each other, a second switching transistor SW2 is disposed in a region where the scan line SCAN and the second data line Data2 intersect each other, and a third switching transistor SW3 is disposed in a region where the scan line SCAN and the third data line Data3 intersect each other.

In the situation of the first switching transistor SW1, a gate electrode thereof is connected to the scan line SCAN, a first electrode thereof protrudes from the first data line Data1, and a second electrode thereof extends in a longitudinal direction of the first data line Data1 between the first and second data lines Data1 and Data 2 adjacent to the first data line Data1.

In the situation of the second switching transistor SW2, a gate electrode thereof is connected to the scan line SCAN, a first electrode thereof protrudes from the second data line Data2, and a second electrode thereof extends in a longitudinal direction of the second data line Data 2 between the second and third data lines Data2 and Data 3 adjacent to the second data line Data 2.

In the situation of the third switching transistor SW3, a gate electrode thereof is connected to the scan line SCAN, a first electrode thereof protrudes from the third data line Data3, and a second electrode thereof extends in a longitudinal direction of the third data line Data 3 between the second and third data lines Data2 and Data 3 adjacent to the third data line Data 3.

First to third driving transistors DR1, DR2 and DR3 are disposed in a region opposite to that of the first to third switching transistors SW1, SW2 and SW3.

In the situation of the first driving transistor DR1, a gate electrode thereof is formed to be integrated with the second electrode of the first switching transistor SW1, a first electrode thereof is connected to the first power stage P/L1 or the third power stage P/L3, and a second electrode thereof is connected to the third electrode 30 of the light emitting element of a first one of the subpixels.

In the situation of the second driving transistor DR2, a gate electrode thereof is formed to be integrated with the second electrode of the second switching transistor SW2, a first electrode thereof is connected to the first power stage P/L1 or the third power stage P/L3, and a second electrode thereof is connected to the first electrode 10 of the light emitting element.

In the situation of the third driving transistor DR3, a gate electrode thereof is formed to be integrated with the second electrode of the third switching transistor SW3, a first electrode thereof is connected to the first power stage P/L1 or the third power stage P/L3, and a second electrode thereof is connected to the third electrode 30 of the light emitting element.

The second electrode 20 is connected to the second power stage P/L2 via a first contact hole C1, the second electrode of the second driving transistor DR2 is connected to the first electrode 10 via a second contact hole C2, the second electrode of the third driving transistor DR3 is connected to the third electrode 30 of a second one of the subpixels via a third contact hole C3, and the second electrode of the first driving transistor DR1 is connected to the third electrode 30 of the first subpixel via a fourth contact hole C4.

FIG. 11 is a plan view of the first electrode, the second electrode, the third electrode and the bank structure shown in FIG. 10.

As shown in FIG. 11, the first electrode 10 and the second electrode 20 are disposed to be integrated with a first subpixel 50a and a second subpixel 50b, and the third electrode 30 is independently disposed at each of the first subpixel 50a and the second subpixel 50b. For example, the blue light emitting diode can have a larger size than each of the red light emitting diodes and the green light emitting diodes, thus the life span of the blue light emitting diode can be extended (e.g., the blue light emitting diode can be greater than or equal to twice the size of each of the red and green light emitting diodes).

The first electrode 10, the second electrode 20 and the third electrode 30 are sequentially stacked, as described with reference to FIGS. 3 and 6.

Hereinafter, a concrete cross-sectional structure of the sub-pixels, configured as described above, according to an embodiment of the present invention will be described.

Figure 12:
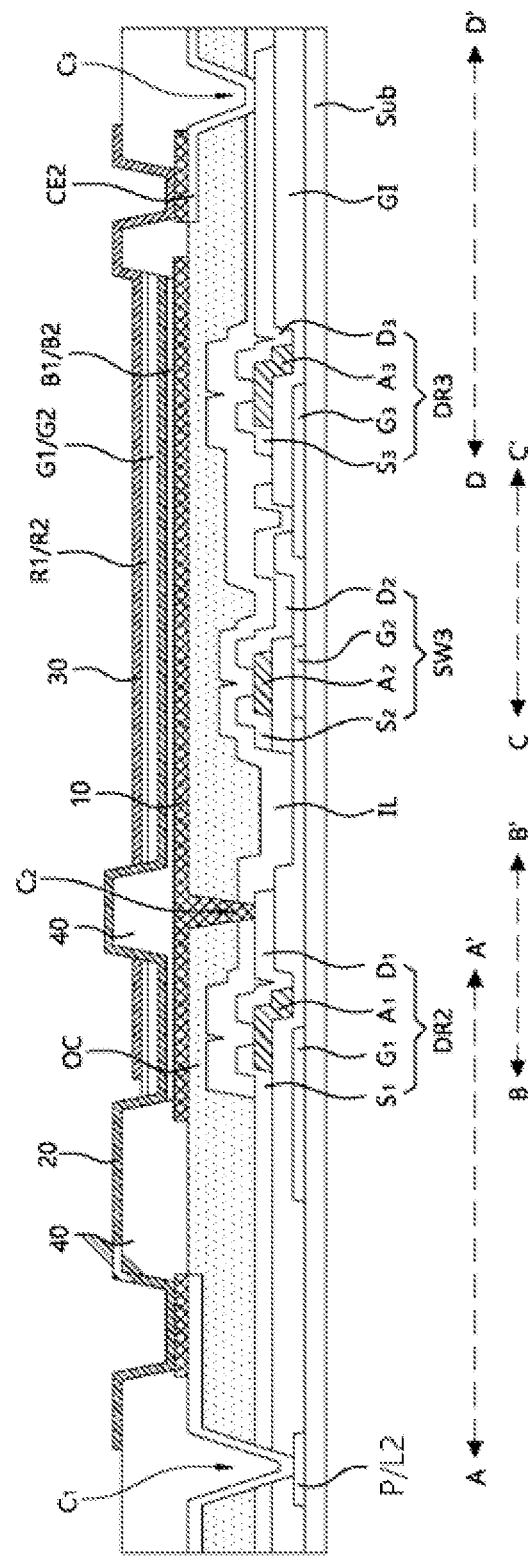
FIG. 12 is a view of a concrete cross-sectional structure of subpixels of a unit pixel according to an embodiment of the present invention.

FIG. 12 is a view of a concrete cross-sectional structure of subpixels of a unit pixel according to an embodiment of the present invention.

The cross-sectional structure of FIG. 12 includes cross-sectional structures taken along lines A-A', B-B', C-C' and D-D' in FIG. 10.

The unit pixel includes first and second subpixels Subpixel 1 and Subpixel 2, and each of the first and second subpixels Subpixel 1 and Subpixel 2 has a structure in which two stacks Stack 1 and Stack 2 are stacked.

The stack structures of the first and second subpixels Subpixel 1 and Subpixel 2 are similar to each other and, in the circuit configuration of the unit pixel of FIG. 9, the configurations of the first red light emitting diode OLED R1 and the first green light emitting diodes OLED G1, the first switching transistor SW1, and the first driving transistor DR1 are identical to the configurations of the second red light emitting diode OLED R2 and the second green light emitting diodes OLED G2, the third switching transistor SW3, and the third driving transistor DR3.

Accordingly, the cross-sectional configuration of only one sub-pixel will be described.

A plurality of gate electrodes G1, G2 and G3 are formed on a substrate Sub, and a gate insulating layer GI is formed on the entire surface of the substrate Sub including the plurality of gate electrodes G1, G2 and G3.

A plurality of active layers A1, A2 and A3 are formed on the gate insulating layer GI, to overlap with the plurality of gate electrodes G1, G2 and G3, respectively, and a plurality of source electrodes S1, S2 and S3 and a plurality of drain electrodes D1, D2 and D3 are formed at opposite sides of the plurality of active layers A1, A2 and A34, respectively.

An interlayer insulating layer IL and an overcoat layer OC are formed on the entire surface of the gate insulating layer GI formed with the plurality of active layers A1, A2, A3 and A4, the plurality of source electrodes S1, S2, S3 and S4 and the plurality of drain electrodes D1, D2, D3 and D4.

A second driving transistor DR2 shown in FIG. 9 is constituted by the gate electrode G1, the active layer A1, the source electrode S1 and the drain electrode D1.

A third switching transistor SW3 shown in FIG. 9 is constituted by the gate electrode G2, the active layer A2, the source electrode S2 and the drain electrode D2.

A third driving transistor DR3 shown in FIG. 9 is constituted by the gate electrode G3, the active layer A3, the source electrode S3 and the drain electrode D3.

Accordingly, the drain electrode D2 of the third switching transistor SW3 is electrically connected to the gate electrode G3 of the third driving transistor DR3.

In addition, a first electrode 10, a blue emission material layer B1 or B2, a second electrode 20, a red emission material layer R1 or R2, a green emission material layer G1 or G2, and a third electrode 30 are sequentially stacked in this order on the overcoat layer OC in a light emission region of the subpixel, as described with reference to FIG. 2.

FIGS. 2, 3 and 6 show that the green emission material G1 or G2 is stacked on the red emission material R1 or R2, whereas FIG. 12 shows that the red emission material R1 or R2 is stacked on the green emission material G1 or G2. Disposition order of the green emission material G1 or G2 and the red emission material R1 or R2 does not influence display of an image.

A contact hole C2 is formed at the interlayer insulating layer IL and the overcoat layer OC, to expose the drain electrode D1 of the second driving transistor DR2, and, as such, the first electrode 10 is electrically connected to the drain electrode D1 of the second driving transistor DR2.

A contact hole C3 is formed at the interlayer insulating layer IL and the overcoat layer OC, to expose the drain electrode D3 of the third driving transistor DR3, and, as such, the third electrode 30 is electrically connected to the drain electrode D3 of the third driving transistor DR3.

In addition, a second power stage P/L2 is electrically connected to the second electrode 20 via a contact hole C1.

FIG. 12 shows that the second electrode 20 is electrically connected to the second power stage P/L2 through stacking of materials of a connecting electrode CE1 and the first electrode 10, and the third electrode 30 is electrically connected to the drain electrode D3 of the third driving transistor DR3 through stacking of materials of a connecting electrode CE2 and the first electrode 10.

In addition, a bank layer 40 defining a subpixel region is formed on the overcoat layer OC in a non-emission region of each subpixel.

Also, the source electrode S1 of the second driving transistor DR2 can be electrically connected to a first or third power stage P/L1 or P/L3.

The gate electrode G2 of the third switching transistor SW3 can be electrically connected to a scan line SCAN or can be formed to be integrated with the scan line SCAN, and the source electrode S2 of the third switching transistor SW3 can be electrically connected to a third data line Data3 or can be formed to be integrated with the third data line Data3.

The source electrode S3 of the third driving transistor DR3 can be electrically connected to the first or third power stage P/L1 or P/L3.

Hereinafter, a driving method of the unit pixel of the organic light emitting display device, configured as described above, according to an embodiment of the present invention will be described.

Figures 13, 14:
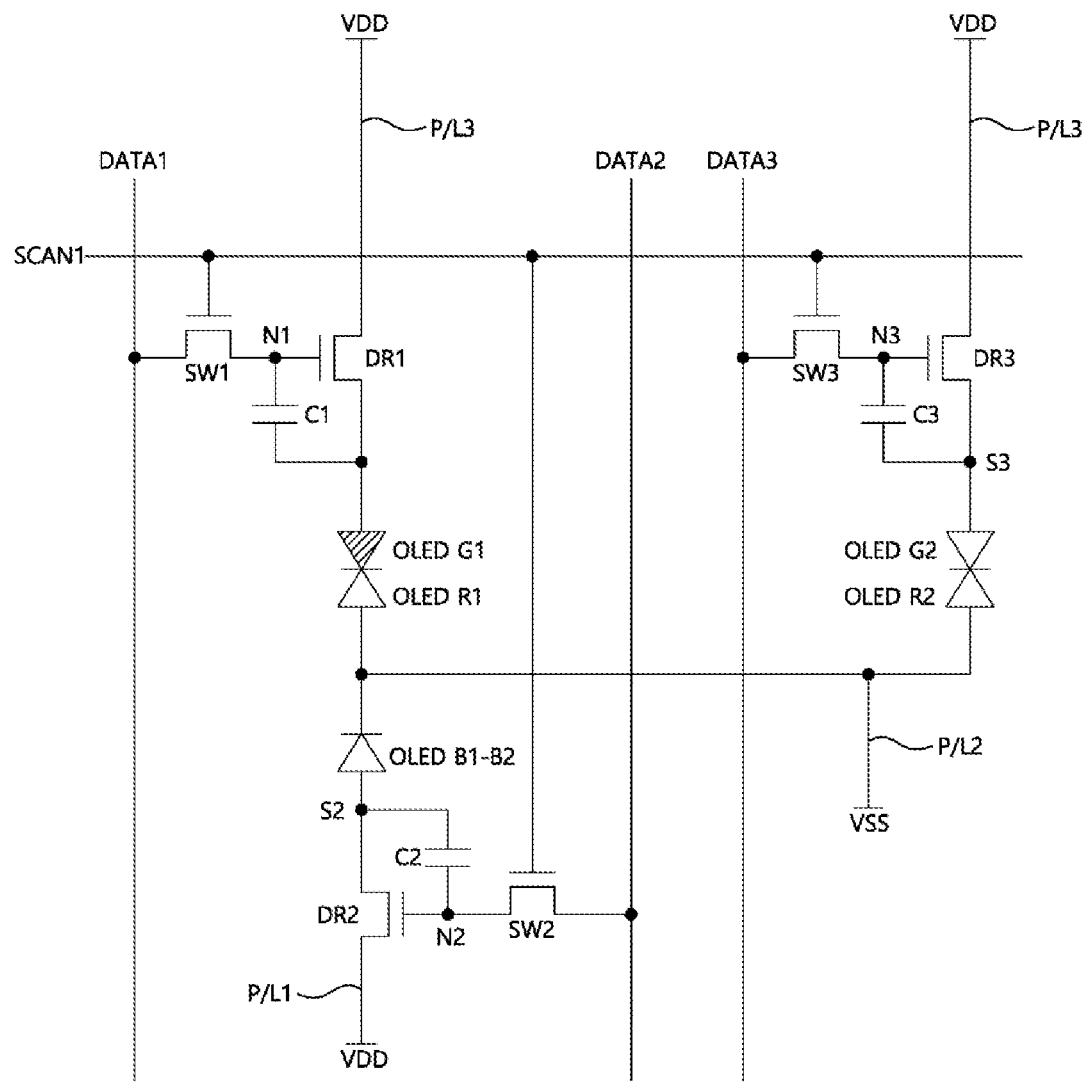
FIG. 13 is a circuit diagram explaining a state in which the unit pixel of the organic light emitting display device according to an embodiment of the present invention emits green.
FIG. 14 is a table showing states of each power stage and each data line for the circuit diagram of FIG. 13 according to an embodiment of the present invention.

FIG. 13 is a circuit diagram explaining a state in which the unit pixel of the organic light emitting display device according to the embodiment of the present invention emits green. FIG. 14 is a table showing states of each power stage and each data line according to the embodiment of FIG. 13.

For green emission of the unit pixel, a select signal is output to multiplexers MUX1, MUX2 and MUX3 respectively connected to three power stages P/L1, P/L2 and P/L3 and, as such, a high-level voltage VDD is applied to a first power stage P/L1 and a third power stage P/L3, and a low-level voltage VSS is applied to a second power stage P/L2.

In this situation, when a data voltage is supplied only to a first data line DATA1, only a first green light emitting diode OLED G1 can be driven.

Figures 15, 16:
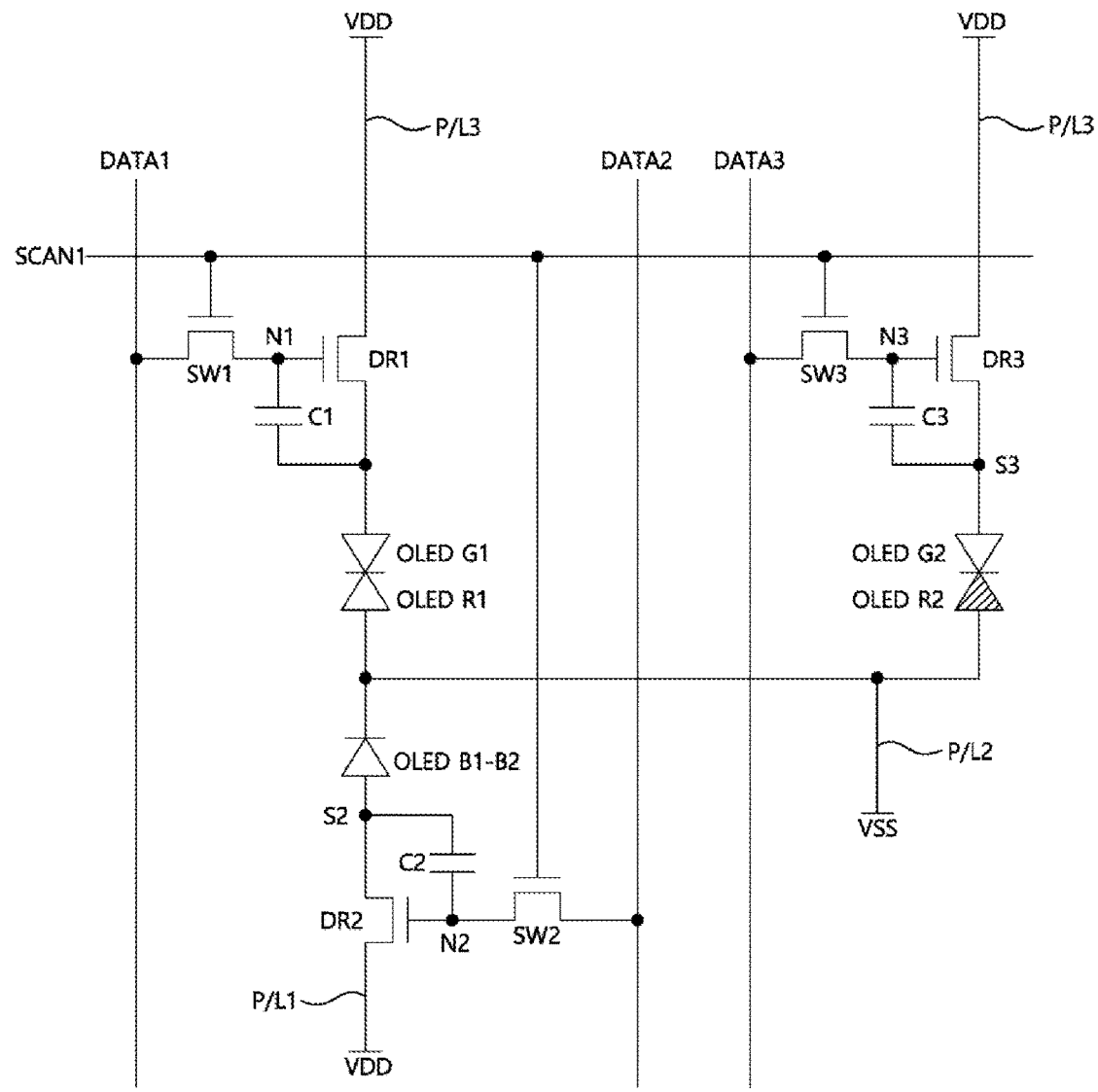
FIG. 15 is a circuit diagram explaining a state in which the unit pixel of the organic light emitting display device according to an embodiment of the present invention emits red.
FIG. 16 is a table showing states of each power stage and each data line according to the circuit diagram of FIG. 15 according to an embodiment of the present invention.

FIG. 15 is a circuit diagram explaining a state in which the unit pixel of the organic light emitting display device according to the embodiment of the present invention emits red. FIG. 16 is a table showing states of each power stage and each data line according to the embodiment of FIG. 15.

For red emission of the unit pixel, the high-level voltage VDD is applied to the first power stage P/L1 and the third power stage P/L3, and the low-level voltage VSS is applied to the second power stage P/L2.

In this situation, when a data voltage is supplied only to a third data line DATA3, only a second red light emitting diode OLED R2 can be driven.

Figures 17, 18:
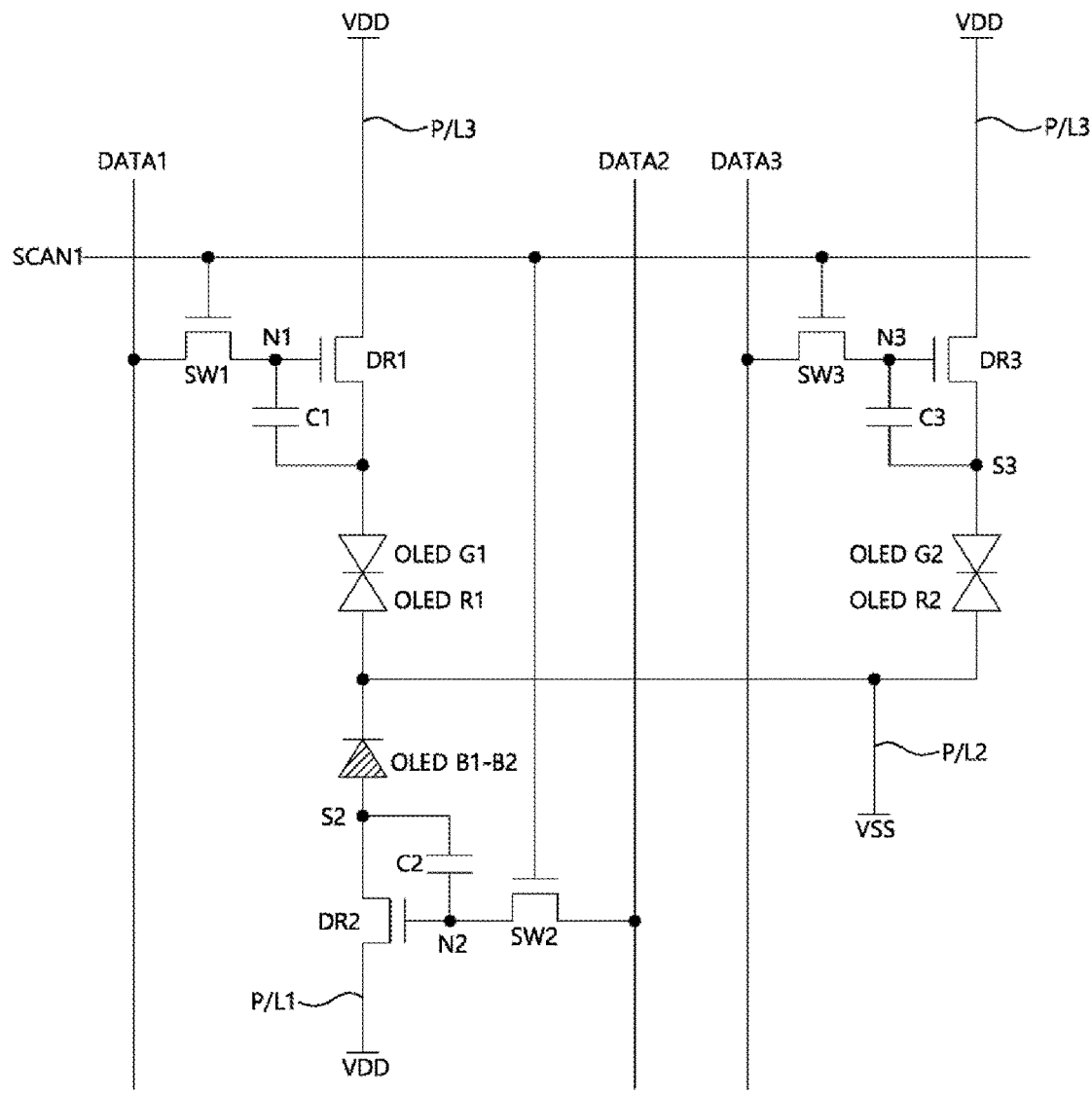
FIG. 17 is a circuit diagram explaining a state in which the unit pixel of the organic light emitting display device according to an embodiment of the present invention emits blue.
FIG. 18 is a table showing states of each power stage and each data line according to the circuit diagram of FIG. 17 according to an embodiment of the present invention.

FIG. 17 is a circuit diagram explaining a state in which the unit pixel of the organic light emitting display device according to the embodiment of the present invention emits blue. FIG. 18 is a table showing states of each power stage and each data line according to the embodiment of FIG. 17.

For blue emission of the unit pixel, the high-level voltage VDD is applied to the first power stage P/L1 and the third power stage P/L3, and the low-level voltage VSS is applied to the second power stage P/L2.

In this situation, when a data voltage is supplied only to a second data line DATA2, only a blue light emitting diode OLED B1-B2 can be driven.

Figures 19, 20:
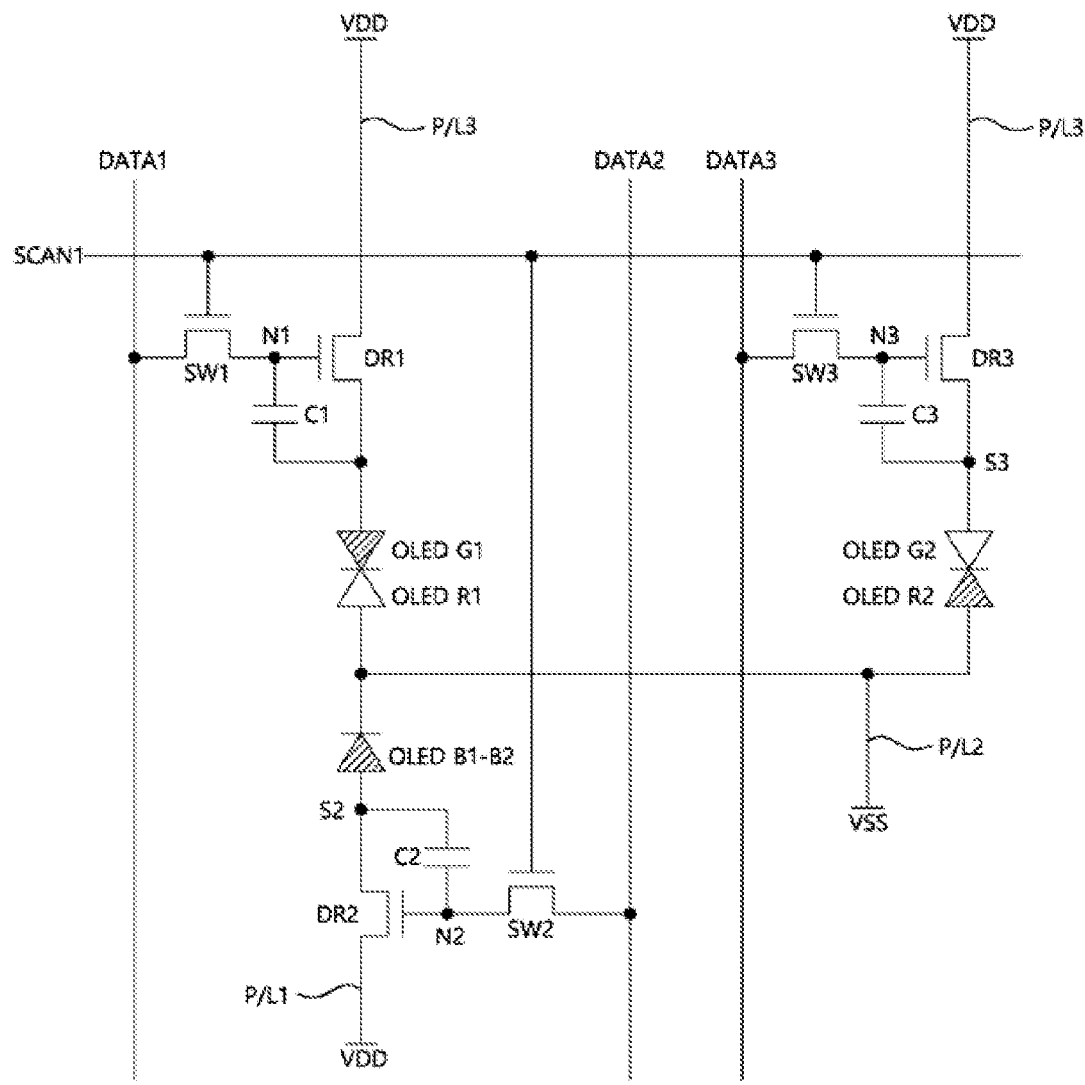
FIG. 19 is a circuit diagram explaining a state in which the unit pixel of the organic light emitting display device according to an embodiment of the present invention emits white.
FIG. 20 is a table showing states of each power stage and each data line according to the circuit diagram of FIG. 19 according to an embodiment of the present invention.

FIG. 19 is a circuit diagram explaining a state in which the unit pixel of the organic light emitting display device according to the embodiment of the present invention emits white. FIG. 20 is a table showing states of each power stage and each data line according to the embodiment of FIG. 19.

For white emission of the unit pixel, the high-level voltage VDD is applied to the first power stage P/L1 and the third power stage P/L3, and the low-level voltage VSS is applied to the second power stage P/L2.

In this situation, when a data voltage is supplied to all of the first to third data lines DATA1, DATA2 and DATA3, the first green light emitting diode OLED G1, the second red light emitting diode OLED R2 and the blue light emitting diode OLED B1-B2 can be simultaneously driven, thereby emitting white.

Meanwhile, when voltages applied to respective power stages P/L1, P/L2 and P/L3 are different, the unit pixel can emit red and green.

Figures 21, 22:
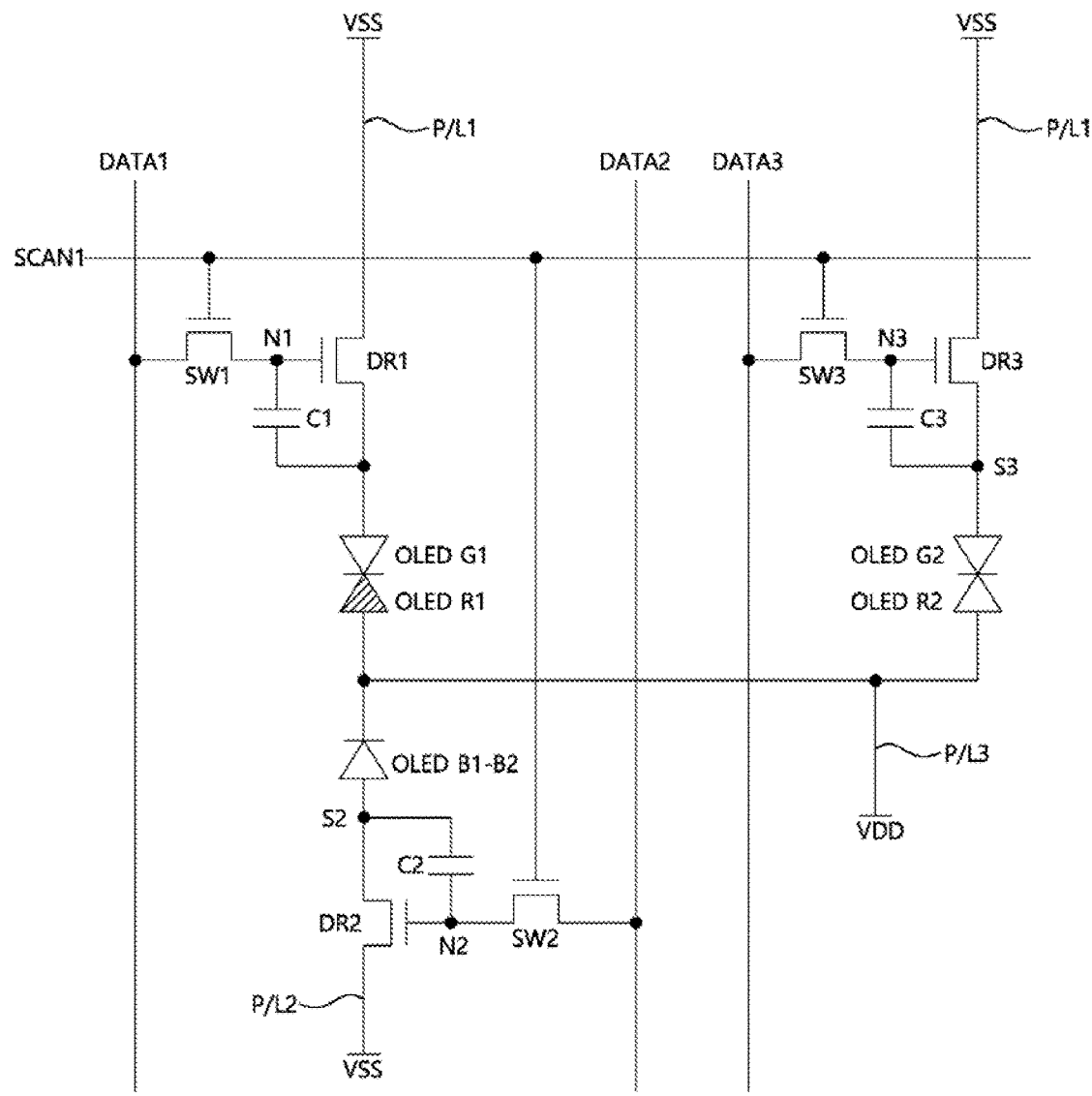
FIG. 21 is a circuit diagram explaining a state in which a unit pixel of an organic light emitting display device according to another embodiment of the present invention emits red.
FIG. 22 is a table showing states of each power stage and each data line according to the circuit diagram of FIG. 21 according to an embodiment of the present invention.

FIG. 21 is a circuit diagram explaining a state in which a unit pixel of an organic light emitting display device according to another embodiment of the present invention emits red. FIG. 22 is a table showing states of each power stage and each data line according to the embodiment of FIG. 21.

For red emission of the unit pixel, a low-level voltage VSS is applied to a first power stage P/L1 and a third power stage P/L3, and a high-level voltage VDD is applied to a second power stage P/L2.

In this situation, when a data voltage is supplied to a first data line DATA1, only a first red light emitting diode OLED R1 can be driven.

Figures 23, 24:
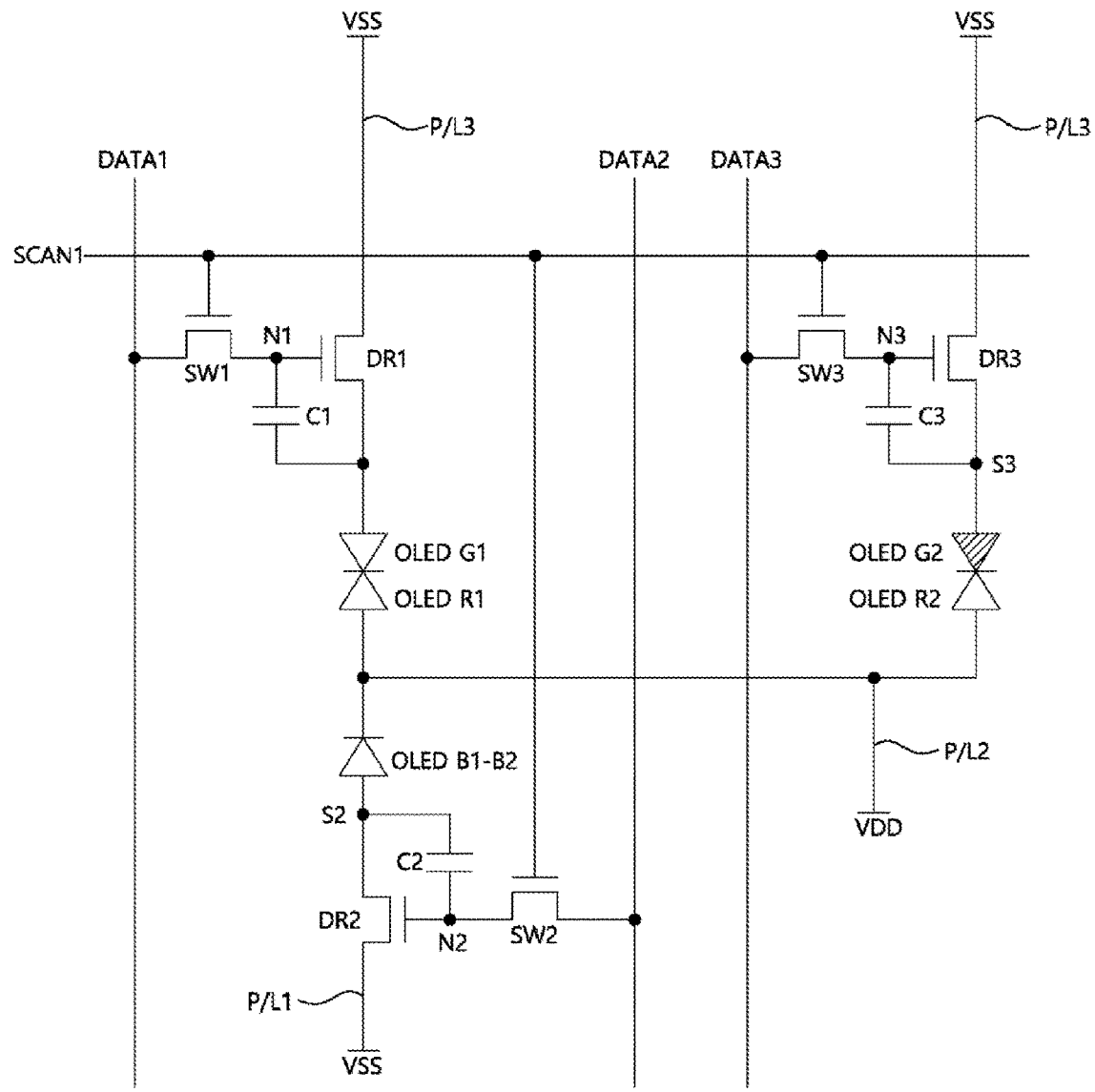
FIG. 23 is a circuit diagram explaining a state in which the unit pixel of the organic light emitting display device according to an embodiment of the present invention emits green.
FIG. 24 is a table showing states of each power stage and each data line according to the circuit diagram of FIG. 23 according to an embodiment of the present invention.

FIG. 23 is a circuit diagram explaining a state in which the unit pixel of the organic light emitting display device according to an embodiment of the present invention emits green. FIG. 24 is a table showing states of each power stage and each data line according to the embodiment of FIG. 23.

For green emission of the unit pixel, the low-level voltage VSS is applied to the first power stage P/L1 and the third power stage P/L3, and the high-level voltage VDD is applied to the second power stage P/L2.

In this situation, when a data voltage is supplied only to a third data line DATA3, only a second green light emitting diode OLED G2 can be driven.

Figures 25, 26:
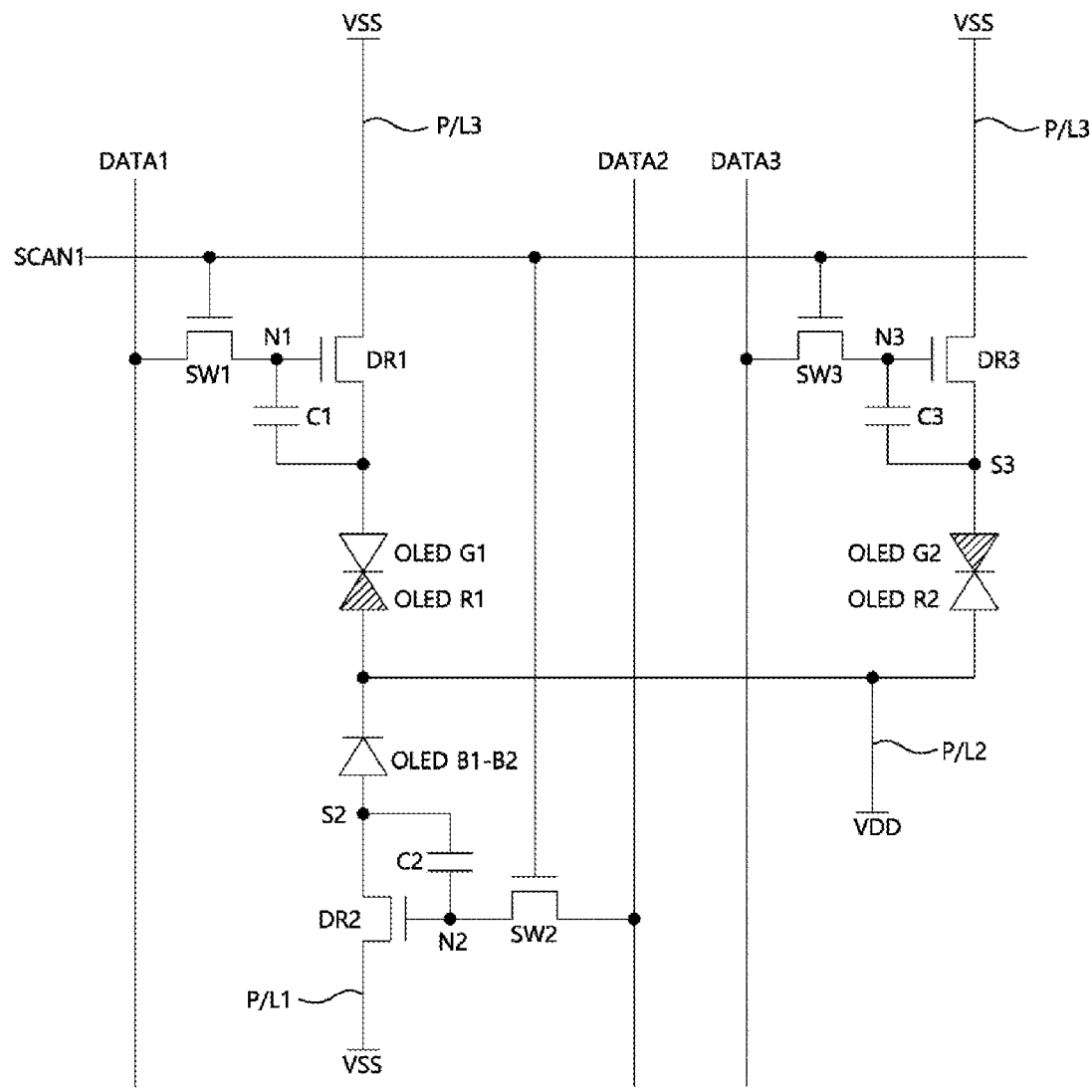
FIG. 25 is a circuit diagram explaining a state in which the unit pixel of the organic light emitting display device according to an embodiment of the present invention emits yellow.
FIG. 26 is a table showing states of each power stage and each data line according to the circuit diagram of FIG. 25 according to an embodiment of the present invention.

FIG. 25 is a circuit diagram explaining a state in which the unit pixel of the organic light emitting display device according to an embodiment of the present invention emits yellow. FIG. 26 is a table showing states of each power stage and each data line according to the embodiment of FIG. 25.

In this situation, the low-level voltage VSS is applied to the first power stage P/L1 and the third power stage P/L3, and the high-level voltage VDD is applied to the second power stage P/L2.

In this situation, when a data voltage is supplied to the first and third data lines DATA3, the first red light emitting diode OLED R1 and the second green light emitting diode OLED G2 can be driven, thereby emitting yellow.

Meanwhile, in a state in which the high-level voltage VDD is applied to the first power stage P/L1 and the third power stage P/L3, and the low-level voltage VSS is applied to the second power stage P/L2, as described with reference to FIGS. 12 to 22, the unit pixel can emit red, green and blue when the data voltage is selectively applied to at least one of the first to third data lines DATA1, DATA2 and DATA3, whereas the unit pixel can emit white when the data voltage is applied to all of the first to third data lines DATA1, DATA2 and DATA3.

Accordingly, the three multiplexers shown in FIG. 9 can be omitted.

As apparent from the above description, the unit pixel is constituted by two subpixels, and is driven by a DC voltage Ac and, as such, can emit red, green, blue and white, as well as yellow. Accordingly, an enhancement in resolution can be achieved.

Light emitting layers used to emit white and to emit red and green can be differently driven and, as such, an organic light emitting display device having a long lifespan can be realized. In this way, the pixel unit can implement a type of failover system. For example, if the red light emitting diode within the first subpixel Subpixel S1 fails or becomes impaired over time, then the red emitting diode in the second subpixel Subpixel S2 can be utilized, or vice-versa, which can effectively double the life space of the pixel unit when it comes to its ability to emit red. Similarly, if the green light emitting diode within the second subpixel Subpixel S2 fails or becomes impaired over time, then the green emitting diode in the first subpixel Subpixel S1 can be utilized, or vice-versa, etc. Also, an alternating driving scheme and a time division driving scheme can be utilized that averages out the use of each of the same colored light emitting diodes to extend the lifespan of the pixel unit.

In addition, in the situation of a blue light emitting diode having a relatively short lifespan, the blue light emitting diode having a larger size can simultaneously drive the two subpixels and, as such, an organic light emitting display device having a long lifespan can be realized.

The foregoing descriptions and the accompanying drawings have been presented in order to illustratively explain technical ideas of the present invention. A person skilled in the art to which the present invention pertains can appreciate that diverse modifications and variations obtained by combining, dividing, substituting for, or changing constituent elements can be possible without changing essential characteristics of the present invention. Therefore, the foregoing embodiments disclosed herein shall be interpreted as illustrative only and not as limitative of the principle and scope of the present invention. It should be understood that the scope of the present invention shall be defined by the appended claims and all of their equivalents fall within the scope of the present invention.

What is claimed is:

1. An organic light emitting display device comprising:
   a display panel including a plurality of data lines and a plurality of scan lines intersecting each other, and unit pixels disposed in a matrix arrangement on a substrate, each of the unit pixels being disposed in a region where one scan line intersects three data lines;
   a data driving circuit configured to drive the plurality of data lines; and
   a gate driving circuit configured to drive the plurality of gate lines,
   wherein each of the unit pixels comprises two subpixels,
   wherein each of the two subpixels has a structure in which red, green and blue light emitting elements are stacked so that the red, green and blue light emitting elements overlap with each other in a vertical direction relative to the substrate,
   wherein the red and green light emitting elements of a first subpixel, among the two subpixels, are stacked to form a hole only device (HOD) structure, and
   wherein the red and green light emitting elements of a second subpixel, among the two subpixels, are stacked to form an electron only device (EOD) structure.

2. The organic light emitting display device according to claim 1, wherein:
   the first subpixel comprises first, second and third electrodes sequentially stacked;
   a first blue light emitting element is disposed between the first electrode and the second electrode; and
   a first redlight emitting element and a first green light emitting element are disposed between the second electrode and the third electrode, to form a HOD structure.

3. The organic light emitting display device according to claim 2, wherein:
   the first blue light emitting element comprises a hole injection layer, a first hole transport layer, a first blue emission material layer and an electron transfer layer sequentially stacked between the first electrode and the second electrode; and
   the first red light emitting element and the first green light emitting element comprise a second hole injection layer, a first electron blocking layer, a first red emission material layer, a charge generation layer, a first green emission material layer, a second electron blocking layer and a third hole injection layer sequentially stacked between the second electrode and the third electrode.

4. The organic light emitting display device according to claim 3, wherein the first red emission material layer and the first green emission material layer are symmetrical with each other with respect to the charge generation layer.

5. The organic light emitting display device according to claim 3, wherein:
only the first red emission material layer is enabled to emit light when a negative (−) voltage is applied to both of the first electrode and the third electrode, and a positive (+) voltage is applied to the second electrode; and
only the first blue emission material layer and the first green emission material layer are enabled to emit light when the positive (+) voltage is applied to both of the first electrode and the third electrode, and the negative (−) voltage is applied to the second electrode.

6. The organic light emitting display device according to claim 5, wherein:
only the second green emission material layer is enabled to emit light when a negative (−) voltage is applied to the first electrode and the third electrode, and a positive (+) voltage is applied to the second electrode; and
only the second red emission material layer and the second blue emission material layer are enabled to emit light when the positive (+) voltage is applied to the first electrode and the third electrode, and the negative (−) voltage is applied to the second electrode.

7. The organic light emitting display device according to claim 1, wherein:
the second subpixel comprises first, second and third electrodes sequentially stacked;
a second blue light emitting element is disposed between the first electrode and the second electrode; and
a second red light emitting element and a second green light emitting element are disposed between the second electrode and the third electrode, to form an EOD structure.

8. The organic light emitting display device according to claim 7, wherein:
the second blue light emitting element comprises a hole injection layer, a first hole transport layer, a first blue emission material layer and an electron transfer layer sequentially stacked between the first electrode and the second electrode; and
the second red light emitting element and the second green light emitting element comprise a first electron injection layer, a first hole blocking layer, a second red emission material layer, a charge generation layer, a second green emission material layer, a second hole blocking layer and a second electron injection layer sequentially stacked between the second electrode and the third electrode.

9. The organic light emitting display device according to claim 8, wherein the second red emission material layer and the second green emission material layer are symmetrical with each other with respect to the charge generation layer.

10. The organic light emitting display device according to claim 1, wherein:
the unit pixel is connected to one scan line and first, second and third data lines; the unit pixel comprises:
a first redlight emitting diode and a first green light emitting diode reversely connected to each other;
a second red light emitting diode and a second green light emitting diode reversely connected to each other;
a blue light emitting diode;
a first switching transistor comprising a gate electrode connected to the scan line, a first electrode connected to the first data line and a second electrode connected to a first node, the first switching transistor is configured to transmit a data voltage of the first data line to the first node in response to a scan pulse from the scan line;
a first driving transistor comprising a gate electrode connected to the first node, a first electrode connected to a third power stage and a second electrode connected to a second node, the first driving transistor is configured to control current flowing through the first red light emitting diode and the first green light emitting diode based on a voltage of the first node;
a second switching transistor comprising a gate electrode connected to the scan line, a first electrode connected to the second data line and a second electrode connected to a third node, the second switching transistor is configured to transmit a data voltage of the second data line to the third node in response to the scan pulse from the scan line;
a second driving transistor comprising a gate electrode connected to the third node, a first electrode connected to a first power stage and a second electrode connected to a fourth node, the second driving transistor is configured to control current flowing through the blue light emitting diode based on a voltage of the third node;
a third switching transistor comprising a gate electrode connected to the scan line, a first electrode connected to the third data line and a second electrode connected to a fifth node, the third switching transistor is configured to transmit a data voltage of the third data line to the fifth node in response to the scan pulse from the scan line; and
a third driving transistor comprising a gate electrode connected to the fifth node, a first electrode connected to a second power stage and a second electrode connected to a sixth node, the third driving transistor is configured to control current flowing through the second red light emitting diode and the second green light emitting diode based on a voltage of the fifth node,
wherein the first red light emitting diode and the first green light emitting diode are connected between the second node and the third power stage, the blue light emitting diode is connected between the fourth node and the first power stage, and the second red light emitting diode and the second green light emitting diode are connected between the sixth node and the second power stage.

11. The organic light emitting display device according to claim 10, wherein the unit pixel further comprises:
a first capacitor connected between the first node and the second node;
a second capacitor connected between the third node and the fourth node; and
a third capacitor connected between the fifth node and the sixth node.

12. The organic light emitting display device according to claim 10, wherein the unit pixel further comprises:
first, second and third multiplexers respectively connected to the first, second and third power stages,
wherein each of the first, second and third multiplexers is configured to select one of a positive (+) voltage and a negative (−) voltage based on a select signal and supply the one of the positive (+) voltage and the negative (−) voltage to a corresponding one of the first, second and third power stages.

13. The organic light emitting display device according to claim 10, wherein:
only the first green light emitting diode emits light when a positive (+) voltage is applied to the first power stage and the third power stage, a negative (−) voltage is applied to the second power stage, and a data voltage is supplied to the first data line; and
only the second red light emitting diode emits light when the positive (+) voltage is applied to the first power stage and the third power stage, and the negative (−) voltage is applied to the second power stage, and a data voltage is supplied to the third data line.

14. The organic light emitting display device according to claim 10, wherein:
only the blue light emitting diode emits light when a positive (+) voltage is applied to the first power stage and the third power stage, a negative (−) voltage is applied to the second power stage, and a data voltage is supplied to the second data line.

15. The organic light emitting display device according to claim 10, wherein:
the first green light emitting diode, the second red light emitting diode, and the blue light emitting diode emit light when a positive (+) voltage is applied to the first power stage and the third power stage, a negative (−) voltage is applied to the second power stage, and a data voltage is supplied to each of the first, second and third data lines, for displaying white.

16. The organic light emitting display device according to claim 10, wherein:
only the first red light emitting diode emits light when a negative (−) voltage is applied to the first power stage and the third power stage, a positive (+) voltage is applied to the second power stage, and a data voltage is supplied to the first data line; and
only the second green light emitting diode emits light when a negative (−) voltage is applied to the first power stage and the third power stage, a positive (+) voltage is applied to the second power stage, and a data voltage is supplied to the third data line.

17. The organic light emitting display device according to claim 10, wherein:
the first red light emitting diode and the second green light emitting diode emit light when a negative (−) voltage is applied to the first power stage and the third power stage, a positive (+) voltage is applied to the second power stage, and a data voltage is supplied to each of the first and third data lines, for displaying yellow.

18. A pixel unit, comprising:
a pair of subpixels constituting the pixel unit, including a first subpixel and a second subpixel,
wherein the first subpixel comprises:
a first stack including a first blue light emitting element disposed between a first electrode and a second electrode; and
a second stack including a first red light emitting element and a first green light emitting element disposed between the second electrode and a third electrode, and a first charge generation layer disposed between the first red light emitting element and the first green light emitting element, the second stack of the first subpixel being stacked on the first stack of the first subpixel to form a hole only device (HOD) structure,
wherein the second subpixel comprises:
a first stack including a second blue light emitting element disposed between the first electrode and the second electrode; and
a second stack including a second red light emitting element and a second green light emitting element disposed between the second electrode and the third electrode, and a second charge generation layer disposed between the second red light emitting element and the second green light emitting element, the second stack of the second subpixel being stacked on the first stack of the second subpixel to form an electron only device (EOD) structure, and
wherein the pixel unit is configured to emit five different colors.

19. The pixel unit according to claim 18, wherein the pixel unit is configured to:
in response to one of the first and second red light emitting elements failing, emit red light using a remaining one of the first and second red light emitting elements, or
in response to one of the first and second green light emitting elements failing, emit green light using a remaining one of the first and second green light emitting elements.

20. The pixel unit according to claim 18, wherein the five different colors of light include red, green, blue, yellow and white.

21. The pixel unit according to claim 18, wherein the pixel unit is connected to a first data line, a second data line, a third data line and one scan line.

* * * * *